United States Patent
Matsumoto et al.

(10) Patent No.: US 6,346,482 B2
(45) Date of Patent: *Feb. 12, 2002

(54) SEMICONDUCTOR DEVICE HAVING AN IMPROVED CONTACT STRUCTURE AND A MANUFACTURING METHOD THEREOF

(75) Inventors: Junko Matsumoto; Shigenori Sakamori; Akemi Teratani; Yoshihiro Kusumi; Tetsuhiro Fukao; Kazuyuki Ohmi; Kanji Tabaru; Nobuaki Yamanaka, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,878

(22) Filed: Oct. 21, 1998

(30) Foreign Application Priority Data

May 8, 1998 (JP) .......................................... 10-125481

(51) Int. Cl.[7] .................. H01L 21/302; H01L 21/3065; H01L 21/311
(52) U.S. Cl. ........................ 438/706; 710/723; 710/724
(58) Field of Search ................................ 438/706, 724, 438/723, 701, 713, 740, 696, 710; 257/774, 905, 401, 390, 758

(56) References Cited

U.S. PATENT DOCUMENTS

| | | | | |
|---|---|---|---|---|
| 4,372,034 A | * | 2/1983 | Bohr ........................... | 438/624 |
| 4,490,209 A | * | 12/1984 | Hartman ....................... | 438/695 |
| 4,735,680 A | * | 4/1988 | Yen .............................. | 438/586 |
| 5,319,246 A | * | 6/1994 | Nagamine et al. ........... | 257/758 |
| 5,352,617 A | * | 10/1994 | Miwa ........................... | 438/234 |
| 5,401,681 A | * | 3/1995 | Dennison ..................... | 438/253 |
| 5,668,052 A | | 9/1997 | Matsumoto et al. ......... | 438/624 |
| 5,801,094 A | * | 9/1998 | Yew et al. ................... | 438/624 |
| 5,811,357 A | * | 9/1998 | Armacost et al. ............ | 438/723 |
| 5,815,433 A | * | 9/1998 | Takeuchi ..................... | 365/182 |

FOREIGN PATENT DOCUMENTS

| | | | |
|---|---|---|---|
| JP | 1-166524 | 6/1989 | ......... H01L/21/302 |
| JP | 2-213129 | 8/1990 | |
| JP | 07-099182 | 4/1995 | |
| JP | 08-153704 | 6/1996 | |
| JP | 09-050986 | 2/1997 | |
| JP | 09-082920 | 3/1997 | ......... H01L/27/108 |
| JP | 09-120953 | 5/1997 | |
| JP | 09-205143 | 8/1997 | |
| JP | 09-321024 | 12/1997 | |
| JP | 09-321249 | 12/1997 | |
| JP | 07-283198 | 10/1998 | |
| KR | 97-52383 | 7/1997 | |
| KR | 97-52462 | 7/1997 | |

OTHER PUBLICATIONS

Wolf, S. and Tauber, R. N., Silicon Proceedings for the VLSI ERA: vol. 1, Process Technology, Lattice Press, USA, p. 555, 1986.*

English Abstract of Korean laid–open publication No. 97–52383, Method For Forming A Self–Alignment Contact Of A Semiconductor Device.

* cited by examiner

Primary Examiner—Robert Kunemund
Assistant Examiner—Lynette T. Umez-Eronini
(74) Attorney, Agent, or Firm—McDermott, Will & Emery

(57) ABSTRACT

There is described formation of a contact hole without involvement of damage to an etching stopper film and deterioration of electric characteristics, achieved by means of a self-alignment method. An interlayer oxide film is etched through an opening of a resist mask, and by means of plasma etching through use of a processing gas comprising a mixture of a rare gas and a CF-based gas, thereby tapering a shoulder of the silicon nitride film. Alternatively, a silicon oxide film and a silicon nitride film are continually etched through an opening of the resist mask, by means of plasma etching through use of a $CH_2F_2$ gas added to a mixed gas including a rare gas and a $C_4F_8$ gas.

14 Claims, 19 Drawing Sheets

|  | $C_3F_6$ group | $C_4F_8$ group |
|---|---|---|
| etching rate selectivity of oxide film to tapered portion of nitride film | more than 25 | more than 25 |
| dropping ratio of etching rate (%) | 10% | 20% | during etching of organic anti-reflection film during etching of silicon oxide film etching rate of organic anti-reflection film (2nm/min)

PRIOR ART

SEMICONDUCTOR DEVICE HAVING AN IMPROVED CONTACT STRUCTURE AND A MANUFACTURING METHOD THEREOF

BACKGROUND OF THE INVENTION

1. Field of the Invention

The present invention relates to a semiconductor device, such as an IC or an LSI, as well as to a method of manufacturing the semiconductor device. Particularly, the present invention relates to a semiconductor device and a manufacturing method thereof in which contact holes are formed in a self-aligned manner.

The present invention relates to a semiconductor device, such as an IC or an LSI, as well as to a method of manufacturing the semiconductor device. Particularly, the present invention relates to a semiconductor device and a manufacturing method thereof in which contact holes are formed in a self-aligned manner.

2. Background Art

In recent years, a self-aligned contact hole (SAC), such as that shown in FIG. 34, has been adopted, as the development of a semiconductor device has advanced toward higher integration and further improved performance, as exemplified by the recently-developed ULSI.

In order to form a self-aligned contact hole, on a silicon semiconductor substrate 1, an element isolation region 2 is first formed as shown in FIG. 34. Subsequently, a gate oxide film 3, a gate electrode 4, and a protective oxide film 5 are formed into predetermined patterns on the substrate 1. A thin protective film 7 is deposited so as to provide electrical isolation on the overall construction of the gate electrode 4. An etching stopper film 8 made of a silicon nitride film is deposited on the oxide film 7, and an interlayer oxide film 11 is deposited on the etching stopper film 8. After a pattern has been formed by means of a photoresist 12, a contact hole 15 is formed by etching.

At this time, the etching of the interlayer oxide film 11 must be stopped at the silicon nitride film 8. If the etching operation is not stopped, the gate electrode 4 will become exposed as shown in FIG. 35, resulting in short-circuiting with an upper wiring layer. To prevent the short-circuit, there must be ensured sufficient etch selectivity between the interlayer oxide film 11 and the silicon nitride film 8.

Further, under such a conventional method, a hole is opened with high etch selectivity with respect to the etching stopper film 8, and in a subsequent step, the etching stopper film is removed from the bottom of the hole. Thus, formation of a hole involves two manufacturing steps, adding to cost and resulting in lower-yield manufacture.

Further, as wiring pitches are miniaturized, the aspect ratio of the hole to be etched increases. Then, as show in FIG. 36, when an opened contact hole is filled with wiring material 21, a void (gap) becomes more apt to arise in an area sandwiched between the gate electrodes at the bottom of the contact hole.

To form a contact hole by means of the self-alignment method, the interlayer oxide film 11 is etched, and a flat portion of the nitride film 8 serving as an etching stopper film is also removed. On the other hand, a tapered area of the etching stopper film provided in the bottom of the contact hole or the etching stopper film provided in proximity of the gate electrodes is desirably left substantially intact in order to protect the gate electrodes.

Therefore, the etching rate at the tapered area of the etching stopper film is desirably lower than that of the interlayer oxide film, according to a difference in material between the nitride film and the interlayer oxide film. That is, the etching selectivity between a nitride film and a interlayer oxide film is desirably large.

A mixture of $C_4F_8$ gas and $CH_2F_2$ gas such as those described in, e.g., Japanese Patent Application Laid-open No. Hei-7-161702 is used for etching a contact hole. In such a dry etching operation, a tapered portion of an etching stopper film is more likely to be etched through sputtering of ions than is a plane portion of the same. For this reason, when a etching stopper film is thin or etching selectivity is insufficient for a tapered portion, the etching stopper film provided at the tapered area is removed simultaneously with the etching of the interlayer oxide film, depending on a positional relationship between the resist pattern and the gate electrode. Resultantly, a dielectric film surrounding the gate electrode is rendered thin. If a contact hole is formed in this situation, a voltage withstand failure may be caused between the gate electrode and a wiring layer to be subsequently formed, thus resulting in a short-circuit and an operation failure.

A conceivable measure to prevent these failures is to increase the thickness of the etching stopper film 8 shown in FIG. 34, to increase the thickness of an oxide film side wall (not shown), as well as to increase the thickness of the protective oxide film 5. Although this method enables prevention of a short-circuit between the gate electrode 4 and a wiring layer to be subsequently formed, the surface irregularities become significant, thus imposing a problem on a subsequent manufacturing process.

FIGS. 37 and 38 show an example of a step of forming a bit line contact (BC) hole during the process of manufacturing a conventional semiconductor memory. FIG. 38 is aplan view, and FIG. 37 is across-sectional view taken along a broken line provided in FIG. 38. In FIGS. 37 and 38, reference numeral 1 designates a semiconductor substrate (Si); 4 designates a gate wiring pattern including gate electrodes; 8 designates a nitride film used for forming a BC hole in a self-aligned manner; and 11 designates an interlayer oxide film.

According to the existing technique, after formation of the interlayer oxide film 11, the photoresist 12 is patterned, thus opening the contact hole 15 (i.e., a bit line contact). At this time, the contact hole 15 is usually formed into a square pattern or a nearly-square pattern. When the interlayer oxide film 11 is etched up to the nitride film 8, the contact hole 15 designed according to such standards is apt to reach the shoulder portion of the nitride film 8.

Deposited components are less likely to adhere to the shoulder portion of the nitride film 8, and hence the shoulder portion of the nitride film 8 is apt to be removed, thus resulting in high possibility of short-circuit between wiring patterns such as that shown in FIG. 39.

Further, the interlayer insulating film 11 and the silicon nitride film 8 have similar characteristics and are etched by the same etching gas, so that it is difficult to secure sufficient etching selectivity between the two films. Therefore, it is required to adopt an etching stopper film that shows an sufficient etching selectivity.

The present invention has been conceived to solve the foregoing problems, and the object of the present invention is to provide a semiconductor device which has a structure to prevent deterioration of the electric characteristics of the device when a contact hole is formed by a self-alignment method, by preventing etching of an electrode protecting area. Further object of the present invention is to provide a method of manufacturing a semiconductor device which enables improvement in reliability of the device and which enables improved-yield in manufacture of the device.

SUMMARY OF THE INVENTION

According to one aspect of the present invention, in a method of manufacturing a semiconductor device, a resist mask is formed on a silicon oxide film laid on a silicon nitride film having a step portion on a semiconductor substrate, in such a way as to have an opening above said step portion. Then, the silicon oxide film is etched through said opening of the resist mask, by means of plasma etching through use of a processing gas comprising a mixture of a rare gas and a CF-based gas, thereby tapering the shoulder of said step portion of said silicon nitride film.

In another aspect, in the method, a mix ratio of said rare gas and said CF-based gas is adjusted to control the position where the step portion of the the silicon nitride film is tapered.

According to another aspect of the present invention, in a method of manufacturing a semiconductor device, a silicon nitride film is anisotropically etched through an opening formed in a silicon oxide film, which is formed on said silicon nitride film on a semiconductor substrate, by means of plasma etching through use of a mixed gas including $Cl_2$ and HBr.

According to another aspect of the present invention, in a method of manufacturing a semiconductor device, a resist mask is formed on a silicon oxide film laid on a silicon nitride film having a step portion on a semiconductor substrate, in such a way as to have an opening above said step portion. Then, the silicon oxide film and the silicon nitride film are etched through said opening of the resist mask, by means of plasma etching through use of a gas mixture formed by addition of a $CH_2F_2$ gas to a mixed gas including a rare gas and a $C_4F_8$ gas.

In another aspect, in the method, a mix ratio of the rare gas and the $CH_2F_2$ gas is adjusted according to the height of the step portion of the silicon nitride film.

According to another aspect of the present invention, a semiconductor device is manufactured which includes a silicon conductive film formed on a semiconductor substrate, a first silicon oxide film formed on said silicon conductive film, a silicon nitride film formed on said first silicon oxide film, and a second silicon oxide film formed on said silicon nitride film. In the method of manufacturing the semiconductor device, a resist mask is formed on said second silicon oxide film so as to have an opening above the silicon conductive film. Then, there are etched said second silicon oxide film, said silicon nitride film, and said first silicon oxide film through said opening of said resist mask, by means of plasma etching through use of a $CH_2F_2$ gas added to a mixed gas including a rare gas and a $C_4F_8$ gas, thereby forming a hole reaching said silicon conductive film.

According to another aspect of the present invention, a semiconductor device is processed which includes a silicon nitride film formed on an underlying film on a semiconductor substrate, said silicon nitride film having a step portion for forming a groove with predetermined width and height, and a silicon oxide film formed on the silicon nitride film. In a method of manufacturing the semiconductor device, a resist mask is formed on said silicon oxide film so as to have an opening above said step portion of said silicon nitride film, and said opening is formed to extend on the upper surface of said step portion of said silicon nitride film by at least 0.1 times the width of the groove. Then, said silicon oxide film is etchched through said opening.

According to another aspect of the present invention, in a method of manufacturing a semiconductor device, an etching stopper film is formed on an underlying layer on a semiconductor substrate, and said etching stopper film is formed so as to have a groove with a width of less than 0.2 $\mu$m and height of not less than 2.5 times of said width. A silicon oxide film is formed on said etching stopper film. A resist mask is formed on said silicon oxide film so as to have an opening above the groove of the etching stopper film. Then, the silicon oxide film is etched through said opening to reach said groove of said silicon nitride film.

According to another aspect of the present invention, in a method of manufacturing a semiconductor device, a $SiO_xN_y$ film having a step portion is formed on an underlying film on a semiconductor substrate and is subjected to a heat treatment. A silicon oxide film is formed on the $SiO_xN_y$ film. A resist mask is formed on the silicon oxide film so as to have an opening above the step portion of the $SiO_xN_y$ film. Then, the silicon oxide film is etched through said opening of the resist mask, thereby forming a hole to reach said $SiO_xN_y$ film.

According to another aspect of the present invention, in a method of manufacturing a semiconductor including a silicon oxide film formed on an underlying layer on a semiconductor substrate, formed on the silicon oxide film is a resist mask having an opening formed at a predetermined location thereon. Then, the silicon oxide film is etched through said opening of the resist mask to form a hall reaching the silicon nitride film, by means of plasma etching through use of a mixed gas including a rare gas and a $C_3F_6$ gas or $CF_3$—O—$CFHCF_3$ gas.

Other and further objects, features and advantages of the invention will appear more fully from the following description.

DETAILED DESCRIPTION OF THE PREFERRED EMBODIMENTS

Figure 1:
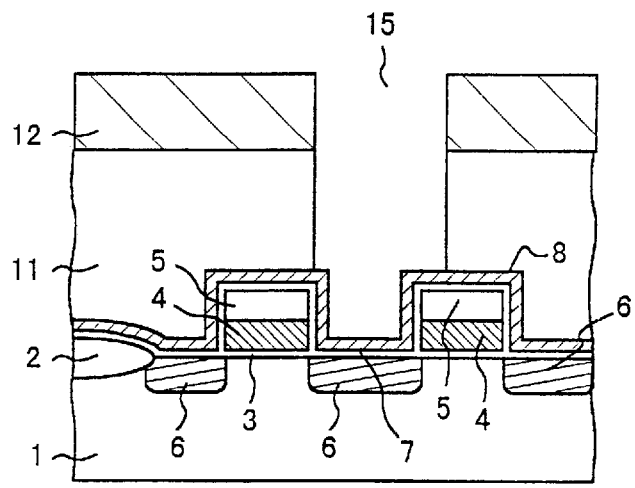
FIG. 1 is a cross-sectional view showing a structure of a semiconductor device according to a first embodiment of the present invention.

Some preferred embodiments of the present invention will now be described by reference to the accompanying drawings. Throughout the drawings, like reference numerals designate like or corresponding elements, and repeated explanations thereof will be simplified or omitted.

First Embodiment

FIGS. 1 through 9 are views for describing a method of manufacturing a semiconductor device according to a first embodiment of the present invention, as well as the structure of the semiconductor device manufactured thereby. Figure 1 shows a cross section of a semiconductor device represented by DRAM in the manufacturing process; and FIGS. 2 through 9 are cross-sectional views showing the process for manufacturing the semiconductor device.

As shown in FIG. 1, the semiconductor device comprises a semiconductor substrate 1; an element isolation region 2 formed on the semiconductor substrate 1; a gate oxide film 3 formed from a silicon oxide film (hereinafter sometimes referred to simply as an oxide film); a gate electrode 4 formed on the gate oxide film 3; a protective oxide film 5 formed on the gate electrode 4; a source/drain region 6; a thin-film oxide film 7 formed over the semiconductor 1, the element isolation region 2, the protective oxide film 5, and the source/drain regions 6; an etching stopper film 8. The thin-film oxide film 7 is formed over the semiconductor 1, the element isolation region 2, the protective oxide film 5, and the source/drain regions 6. The etching stopper film 8 is formed over the thin-film oxide film 7 to suppress the progress of etching, and is formed from a silicon nitride film (hereinafter referred to simply as a nitride film, when necessary).

FIGS. 2 through 9 show a series of continual manufacturing processes according to the first embodiment in the form of eight drawings. A method of forming a self-aligned contact hole according to the first embodiment will now be described.

Figure 2:
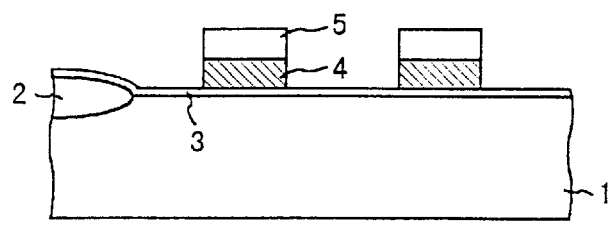
FIGS. 2 through 9 are cross-sectional views showing a method of manufacturing a semiconductor device according to the first embodiment.

As shown in FIG. 2, the element isolation region 2 is first formed on the semiconductor substrate 1, and an oxide film used for forming the gate oxide film 3 is deposited over the semiconductor substrate 1 and the element isolation region 2. A polycrystalline silicon layer used for forming the gate electrode 4 is deposited on the gate oxide film 3. Further, an oxide film used for forming the protective oxide film 5 is deposited on the gate electrode 4.

A non-illustrated resist pattern is formed on the wafer, and the wafer is etched while the resist pattern is used as a mask, thus forming the gate oxide film 3, the gate electrode 4, and the protective oxide film 5 in respective predetermined patterns.

Figure 3:
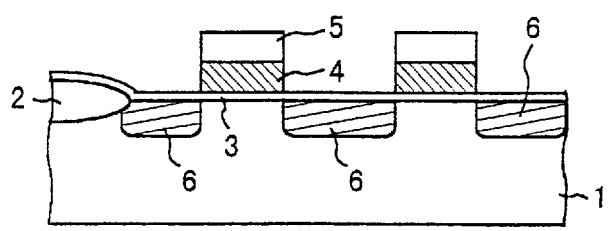
Figure 4:
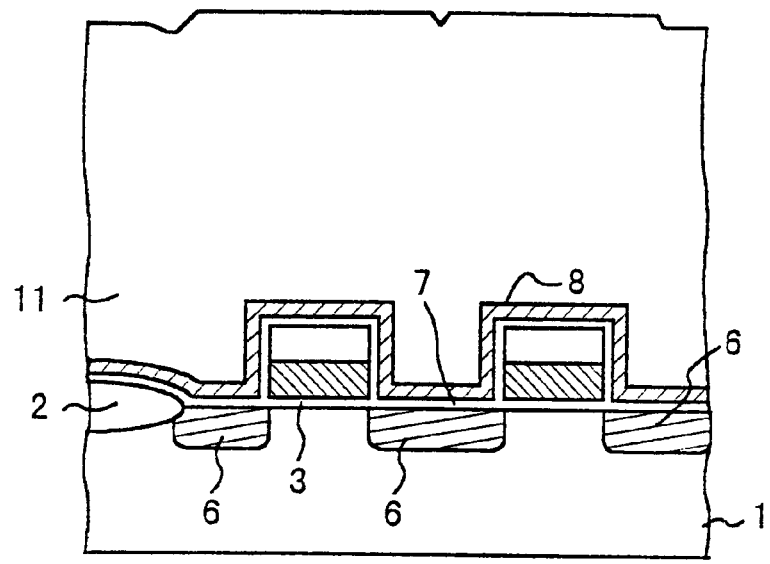

As shown in FIG. 3, ions such as phosphor (P) ions are implanted into the wafer while the gate electrode 4 and the non-illustrated resist pattern are used as masks, thereby forming the n-type source/drain regions 6, as exemplified in FIG. 4. At this time, the ions are implanted at low concentration so as to suppress a short-channel effect. Further, CMOS can be actually manufactured by forming p-type source/drain regions through implantation of ions while a resist pattern is used and by coating the previously-formed source/drain regions.

As shown in FIG. 4, the thin-film oxide film 7 for insulation purposes is deposited over the entire surface of the wafer to a thickness of 15 nm. In the present embodiment, the etching stopper film 8—which is formed from a nitride film to protect a lower layer from etching—is deposited on the thin-film oxide film 7 to a thickness of 50 nm, and an interlayer oxide film 11 is deposited on the etching stopper film 8.

The thin-film oxide film 7 is important in preventing the nitride film 8 from coming into direct contact with the semiconductor substrate 1 and the gate electrode 4. More specifically, the thin-filmoxide film 7 is effective in reducing crystalline imperfections stemming from the stress exerted on the nitride film and the semiconductor substrate, as well as in improving the resistance of the gate to hot carriers.

Figure 5:
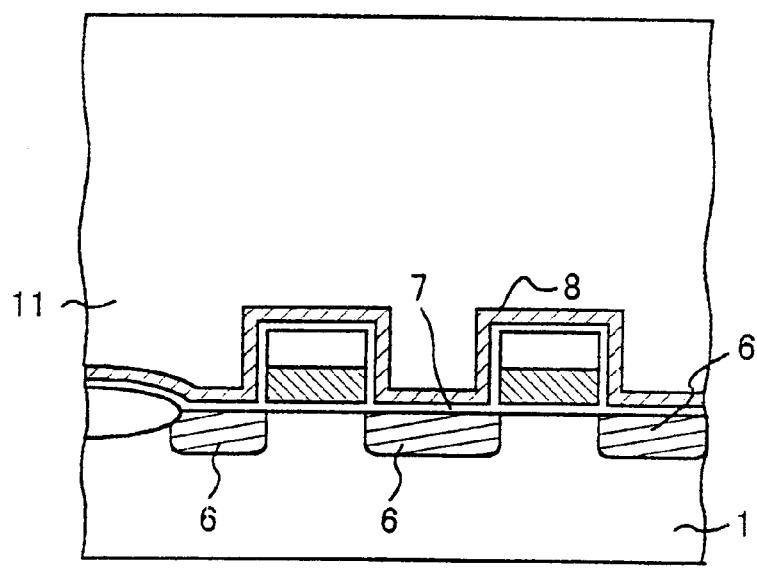

As shown in FIG. 5, the interlayer oxide film 11 has an irregular surface caused by the pattern formed in the previous steps. The oxide film is made smooth through etching, such as RIE, by means of an etch-back technique, thus forming the smooth interlayer oxide film 11.

Figure 6:
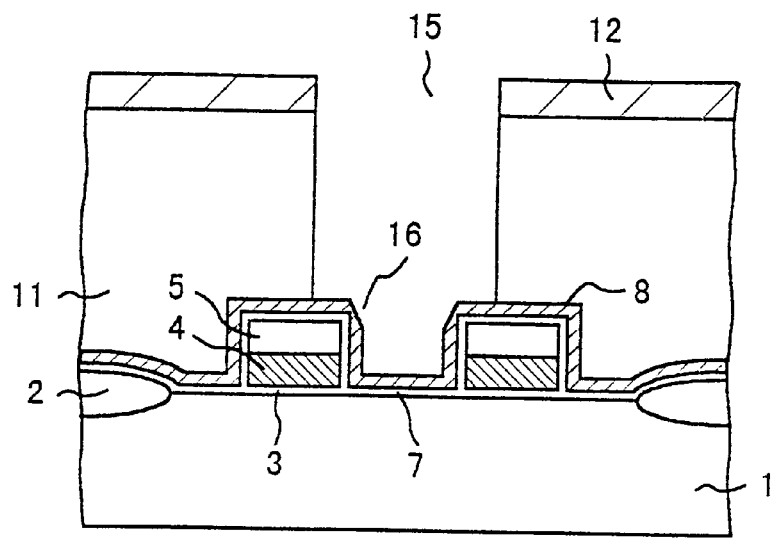

As shown in FIG. 6, the resist pattern 12 to be used for forming a predetermined contact hole is formed on the interlayer oxide film 11. Alternatively, in some cases, an organic reflection prevention film is deposited under the resist pattern. In the present embodiment, there is described that a reflection prevention film is not formed below the resist pattern.

The interlayer oxide film 11 is selectively etched with respect to the nitride film 8 in a mixed gas (a rare gas/$C_4F_8$ gas) atmosphere comprising a rare gas (an inactive gas such as Ar or He) and a C4F8 gas, through use of high-density plasma such as ICP or ECR. As a result, as shown in FIG. 6, the shoulders of the nitride film 8 are tapered.

Figure 7:
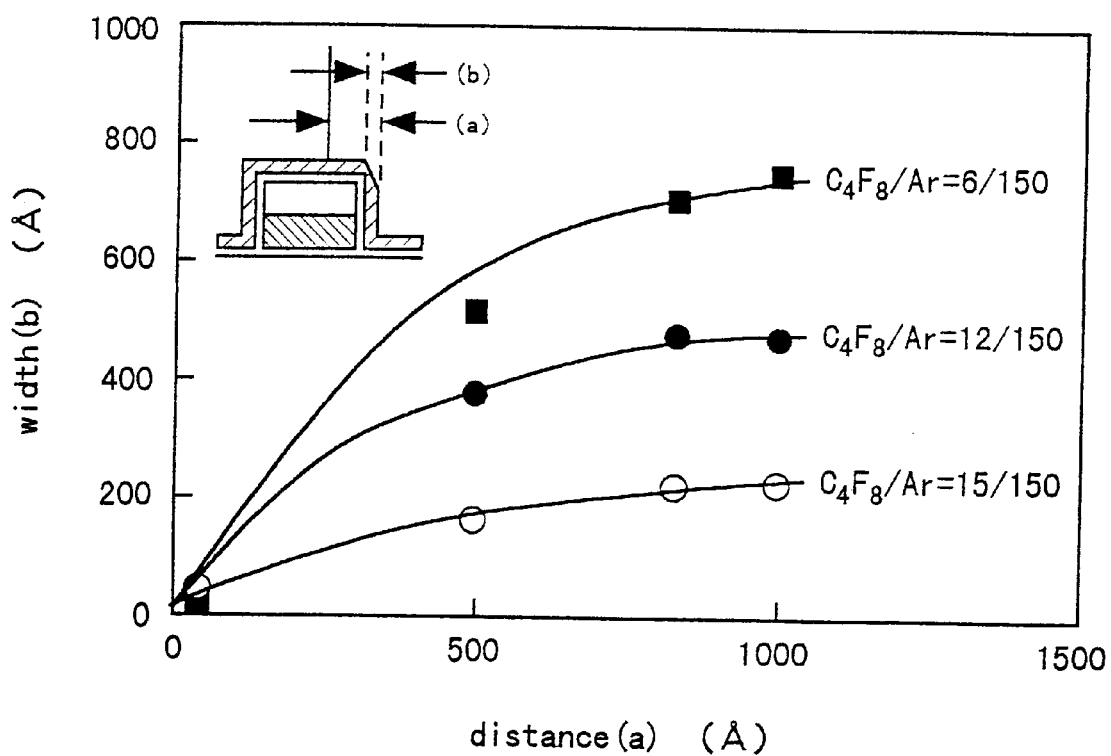

FIG. 7 is a graph showing the position from which tapering of the shoulder of the nitride film is commenced in a case where the $Ar/C_4F_8$ gas is used as an etching gas. In FIG. 7, reference symbol a designates a distance between the side wall surface of the nitride film and the wall of the hole formed in the resist pattern; and b designates the width of the tapered portion or the position from which tapering of the shoulder is commenced. When the alignment accuracy of photolithography is 0.05 $\mu$m, the distance a is set to about 0.05 $\mu$m in order to ensure a margin for an alignment error.

At this time, a mixed gas including a $C_4F_8$ gas and an Ar gas is used as a gas for etching the contact hole, and a flow ratio of $C_4F_8$ to Ar is set to 12:150. As shown in FIG. 6 and FIG. 7, the stopper film provided at the bottom of the contact hole can be tapered at a position 300 to 400 Å spaced away from the side surface of the gate electrode 4.

The position where the stopper film is tapered can be controlled by adjusting the gas flow ratio used for etching.

Figure 8:
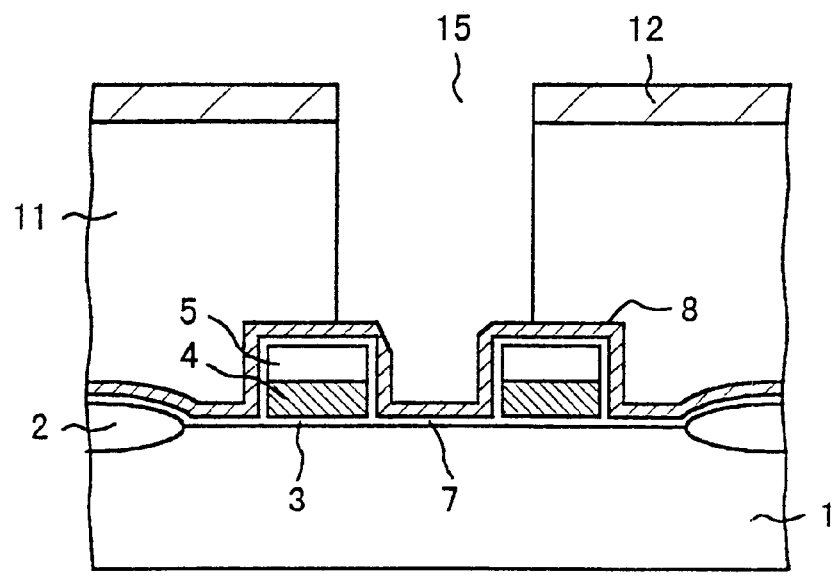

Even if there arises an alignment error, as shown in FIG. 8, the tapered portion formed around the bottom of the contact hole is not significantly increased, as can be seen from FIG. 7. Therefore, the contact hole can be etched without involvement of a short-circuit between the gate electrode and the contact hole, by selection of an appropriate gas flow rate.

Although a mixed gas including an Ar gas and a $C_4F_8$ gas is used in the foregoing example, tapered areas can be formed in an analogous manner even through use of another CF-based gas having a different composition. The position where a tapered area is to be formed can be controlled by adjustment of the flow rate of gas, thus yielding an advantageous result analogous to that yielded in the previous example.

Figure 9:
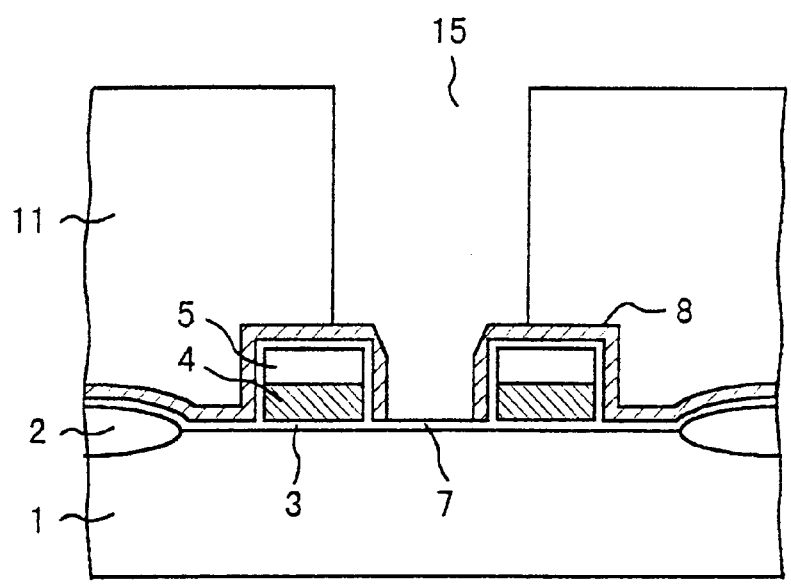

As shown in FIG. 9, subsequent to the foregoing step, the etching stopper film (SiN film) 8 is etched back. As a result of use of a $Cl_2$ gas and a HBr gas as an etching gas, the nitride film (SiN film) 8 can be anisotropically etched at high selectivity with respect to the oxide film 7 underlying the nitride film 8.

In the process of etching the stopper film (SiN) 8 after etching of the interlayer oxide film 1, the SiO/SiN selectivity is set to 20 or more. With such a selectivity, even if the nitride film is tapered when the interlayer oxide film is etched, an electrical short-circuit between the gate electrode and the contact hole can be prevented.

A specific method will now be described. In a case where a parallel plate plasma enhanced etcher is used, the interlayer oxide film is etched under the conditions that the $Cl_2$—HBr gas flow rate is 100/30 ccm, pressure is 100 mTorr, RF power of an upper electrode is 500W, and RF power of a lower electrode is 100W. Then, the etching stopper film can be anisotropically etched back at a high SiO/SiN selectivity of 20 or more.

Subsequently, the contact hole is filled with conductive material, so that a superior contact hole can be formed without involvement of a void at the bottom of the contact hole.

As mentioned above, according to the first embodiment, tapered angle can be formed at the bottom of the contact hole which allows smooth filling of conductive material into the contact hole. As a result, a filling failure can be prevented.

The position where a tapered area is to be formed can be controlled by adjustment of the gas ratio at the time of an etching operation.

Second Embodiment

FIGS. 10 through 13 are views for describing a method of manufacturing a semiconductor device according to a second embodiment of the present invention, as well as the structure of the semiconductor device manufactured thereby.

Figure 10:
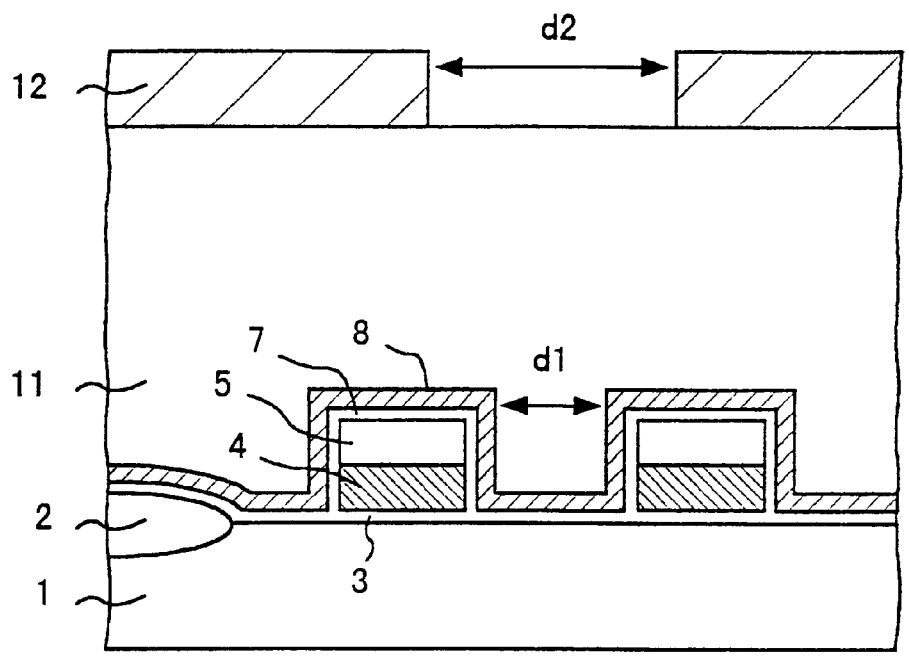
FIGS. 10 through 12 are a cross-sectional view showing a method of manufacturing a semiconductor device according to a second embodiment of the present invention and the structure of the semiconductor device manufactured thereby.

FIG. 10 shows the cross-sectional structure of a semiconductor device represented by, e.g., DRAM, during the manufacturing process. The semiconductor device shown in FIG. 10 is substantially the same in construction as that shown in FIG. 1. Since identical elements are assigned identical reference numerals, repetition of their explanations will be omitted here. However, in FIG. 10, the diameter of a contact hole (or groove) to be formed is denoted by reference symbol d1, and an opening of a resist pattern has diameter d2.

There will now be described a series of continual processes for forming the structure of the semiconductor device such as that mentioned above.

First, a wafer is subjected to the manufacturing processes identical with those described previously by reference to FIGS. 2 through 5.

As a result, as shown in FIG. 10, there is obtained a semiconductor device including the resist pattern 12 formed over the interlayer oxide film 11. Although on some occasions a reflection prevention film is deposited below the resist pattern 12, the reflection prevention film will be omitted here.

The area of the resist pattern 12 required to form a contact hole is the area designated by d1 in the drawing. However, to form a contact hole by means of a self alignment technique, there is formed an opening with diameter d2 in the resist pattern 12 which is larger than the diameter d1.

Figure 11:
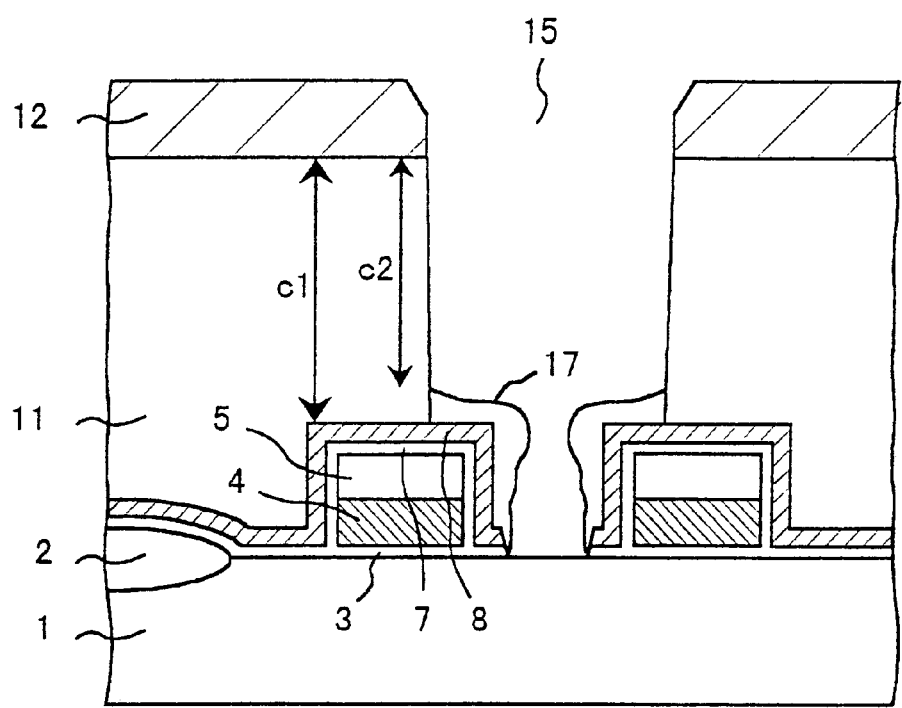

Next, while the resist pattern 12 is used as a mask, the interlayer insulting film 11 is etched selectively with respect to the nitride film 8, through use of high-density plasma such as ICP or ECR, as well as a gas formed by adding a $CH_{2F2}$ gas to a mixed gas (a rare gas/$C_4F_8$. gas) including a rare gas (an inactive gas such as Ar or He) and a $C_4F_8$ gas. As shown in FIG. 11, the depth of the insulating layer 11 is designated as c1, and the depth of the starting point of the deposition is designated as c2.

A specific example of etching conditions is as follows:
Ar/$C_4F_8$/$CH_2F_2$=150/12/5–20 sccm, 12Pa, source power of 1200W, and bias power of 1600W When the diameter d1 to be removed between gate electrodes=0.1 μm and c1 =250 nm, then $CH_2F_2$=20 sccm (c2 =200–250 nm).

When the diameter d1 to be removed between gate electrodes =0.1 μm and c1=550 nm, then $CH_2F_2$=20 sccm (c2 =400–550 nm).

As shown in FIG. 11, as a result of addition of $CH_2F_2$ gas to the mixed gas, adhesion of a deposition 17 to the inner side wall of the contact hole 15 is promoted. The stopper nitride film 8 provided along the shoulder of the gate electrode 4 is protected from etching. At this time, the oxide/nitride selectivity assumes a value of 20 or more.

The vertical position denoted by reference c2 shown in FIG. 11—from which the depositions 17 starts to adhere to the inner side wall—shifts close to the opening surface of the contact hall if the amount of $CH_2F_2$ gas to be added is increased. In contrast, if the amount of $CH_2F_2$ gas is reduced, the position shifts to a deeper location.

Since deposition becomes more difficult to adhere to the inner surface of the contact hole 15 as the diameters d1 and d2 of the holes increase, the amount of $CH_2F_2$ gas to be added must be increased.

More specifically, the amount of $CH_2F_2$ gas to be added should be controlled depending on the desired structure of a semiconductor device as represented by depth c1 where the nitride film on the shoulder of the gate electrode becomes exposed and by the diameter d1 of the groove between the gate electrodes 4. As a result, the position at which depositions adhere to the inner surface of the contact hole can be controlled.

Figure 12:
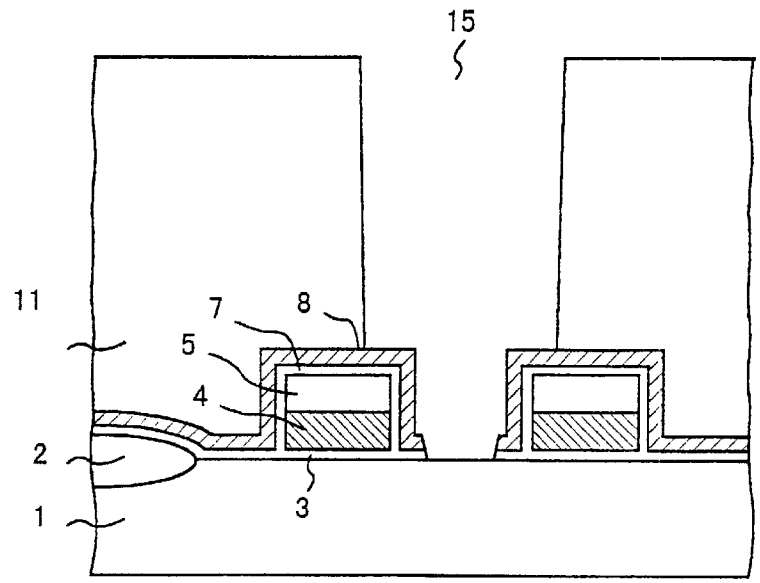

The presence of the depositions 17 on the inner side wall in the narrow groove between the gate electrodes 4 limits entry of radicals, thus permitting only ions to reach the bottom of the contact hole 15. As a result, the difference in etching rate between the oxide film and the nitride film is eliminated (i.e., the oxide/nitride selectivity is about one), thus etching the stopper film provided on the bottom of the contact hole 15. The depositions 17 adhering to the side wall is removed at the time of resist ashing, as shown in FIG. 12.

As set forth, according to the second embodiment, since the wafer is subjected to plasma etching through use of a mixture of rare gas/$C_4F_8$ gas having $CH_2F_2$ gas added thereto, the presence of deposition on the inner side wall of the contact hole protects the stopper film on the gate electrode from etching, thus ensuring a margin for an electrical short-circuiting between the gate electrode and the contact hole. Simultaneously, the nitride film can be removed from the bottom of the contact hole, thereby ensuring electrical contact.

Further, according to the second embodiment, the forming of the contact hole in the interlayer oxide film 11 and the removal of the stopper nitride film 8 from the bottom of the contact hole can be carried out simultaneously.

Further, so long as the wafer is continually subjected to an ashing process in an identical chamber, the manufacturing process can be simplified, and a minute contact hole can be formed without involvement of an electrical short-circuiting between the contact hole and the gate electrode 4, thus resulting in an improvement in the degree of integration, manufacturing yield, and reliability.

Figure 13:
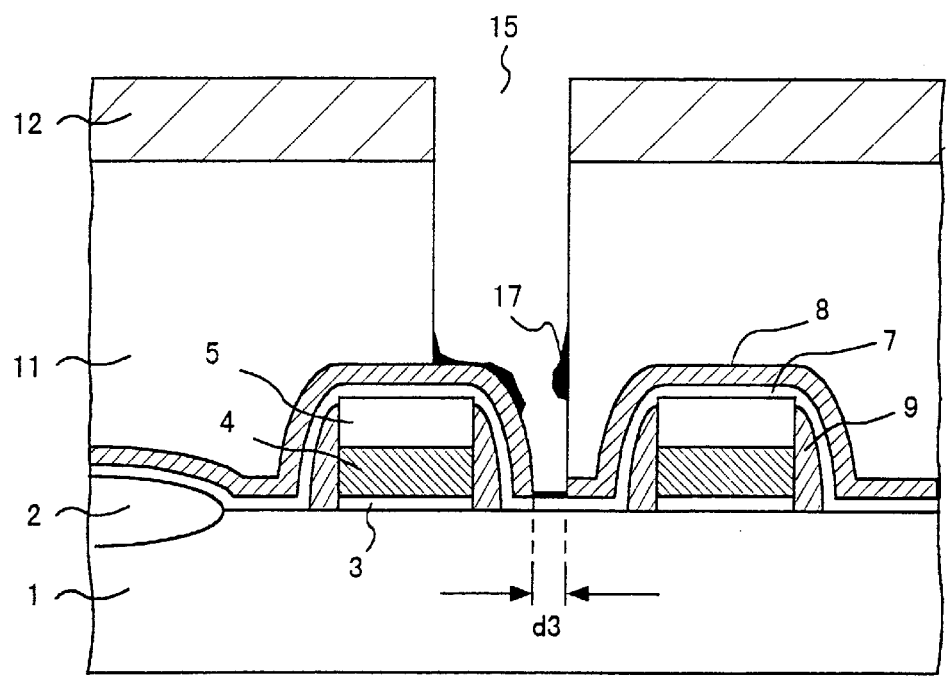
FIG. 13 is a cross-sectional view showing another method of manufacturing a semiconductor device according to the second embodiment and the structure of the semiconductor device manufactured thereby.

FIG. 13 is a cross-sectional view showing another method of forming a contact hole according to the second embodiment. In FIG. 13, a contact hole is opened by removal of the silicon nitride film 8 and the thin-film oxide film 7 from the inside of the contact hole through use of a parallel plate plasma enhanced CVD system.

A contact hole is etched at a pressure of 0.8 to 1.3 Pa, through use of an ICP plasma etching system, as well as an etching gas formed by addition of a small amount of $CH_2F_2$ (10–20 sccm) to a $C_4F_8$/Ar gas of 12/150 sccm. The deposition film 17 is formed in the vicinity of an upper portion of the narrow groove between the gate electrodes, thus stopping the process of etching of the silicon nitride film 8.

In contrast, the presence of the deposition film 17 in the vicinity of an upper portion of the narrow groove limits entry of radicals, which would cause a deposition effect, into the bottom of the narrow groove. Accordingly, the etching of the silicon nitride film 8 proceeds to the bottom of the narrow groove, thus rendering the silicon nitride film 8 thin.

When the width d3 of the narrow groove is $\leq 0.15\,\mu$, the following phenomenon becomes noticeable. In a wide area (a hole diameter $\geq 0.3\,\mu$m) such as an upper portion of the narrow slit, an etching rate of an oxide film assumes a value of about 700 nm/min, and an etching rate of a nitride film assumes a value of less than 100 nm/min. In contrast, at the bottom of the narrow groove, the etching rate of an oxide film assumes a value of about 500 nm/min, and the etching rate of a nitride film also assumes a value of about 500 nm/min.

As mentioned above, suppose the contact hole is etched under the foregoing conditions and through use of the ICP plasma etching system. In the subsequent process, the silicon nitride film 8 and the thin-film oxide film 7 are etched through use of the parallel plate plasma enhanced CVD system. Even when the etching rate of the silicon nitride film 8 at the bottom of the narrow groove decreases as a result of RIE lag, the contact hole can be opened without involvement of over-etching.

As mentioned above, according to the second embodiment, if the contact hole lies on one of two gate electrodes as a result of a significant miss-alignment arising when the contact hole is patterned by means of photolithography, and if a narrow groove is formed between the gate electrodes, the contact hole can be stably opened without involvement of an electrical short-circuiting between the contact hole and the gate electrode.

As described above, according to the second embodiment, a deposition adheres to the inner side wall of the contact hole through the effect of an added gas, thus protecting the stopper film laid along the shoulder of the gate electrodes. As a result, while a margin for short-circuiting between the gate electrode and the contact hole is ensured, the nitride film can be removed from the bottom of the contact hole, thus ensuring electrical contact.

Further, as mentioned above, the interlayer insulating film and the stopper film provided on the bottom of the contact hole can be simultaneously etched away, thus resulting in a reduction in the number of manufacturing processes and cost, as well as improved manufacturing yield.

Third Embodiment

Figure 14:
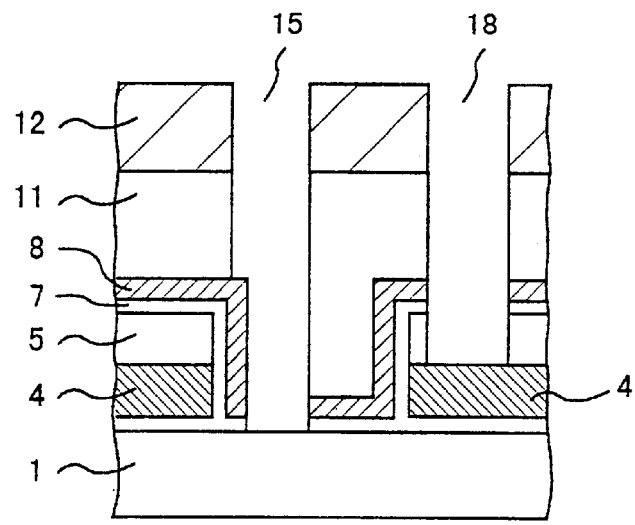
FIG. 14 is a cross-sectional view showing a method of manufacturing a semiconductor device according to a third embodiment of the present invention and the structure of the semiconductor device manufactured thereby.

FIG. 14 is a cross-sectional view for describing a method of manufacturing a semiconductor device according to a third embodiment, as well as the semiconductor device manufactured thereby.

As shown in FIG. 14, according to the third embodiment, a contact hole 18 which lies on the gate electrode 4 can be opened while the contact hole 15 is opened by means of the self-alignment technique described in the second embodiment.

The contact hole 18 that lies on the gate electrode 4 can be opened by utilization of the following phenomenon. First, the oxide/nitride selectivity at the bottom of the contact hole drops during the etching of the interlayer oxide film 11. Secondly, the materials to be used for an electrode (e.g., polysilicon or silicide) exhibit etching selectivity.

The gate electrode 4 may be another conductor. Further, the nitride film 8 laid on the gate electrode 4 is not limited to the etching stopper film deposited at the time of formation of the structure which has been described in the previous embodiment and is shown in FIG. 10.

As mentioned above, according to the third embodiment, a self-aligned contact hall and a contact hole to a gate electrode can be opened simultaneously. Accordingly, the number of manufacturing processes and cost can be significantly reduced.

Fourth Embodiment

Figure 15:
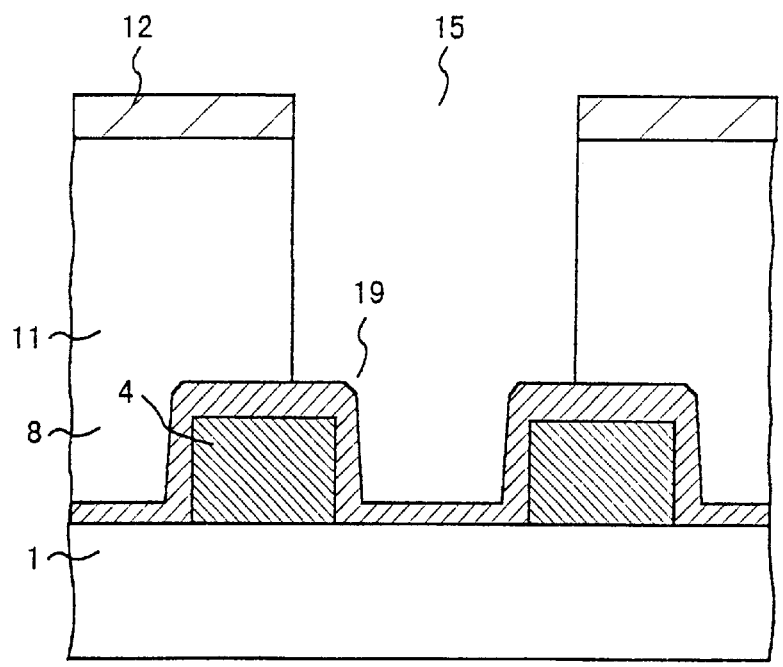
FIGS. 15 through 17 are cross-sectional views or plan view showing a method of manufacturing a semiconductor device according to a fourth embodiment of the present invention and the structure of the semiconductor device manufactured thereby.
Figure 16:
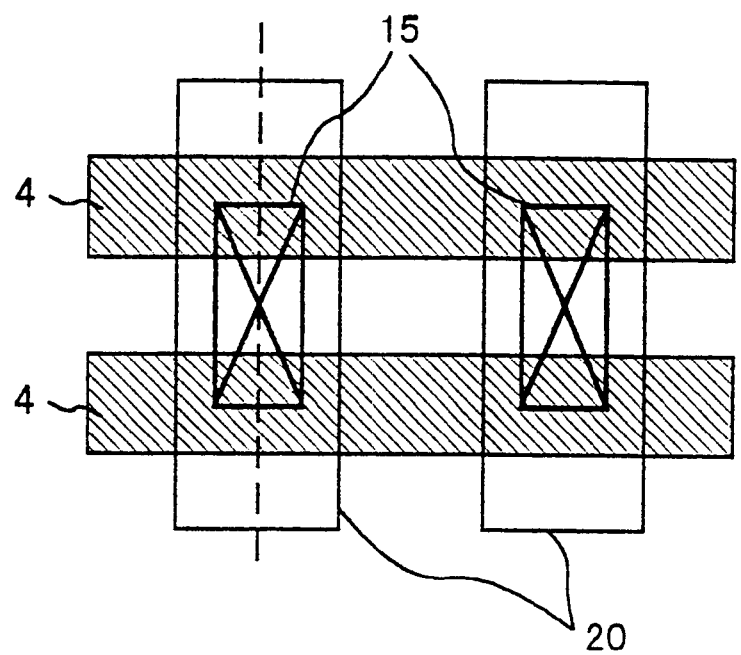
Figure 17:
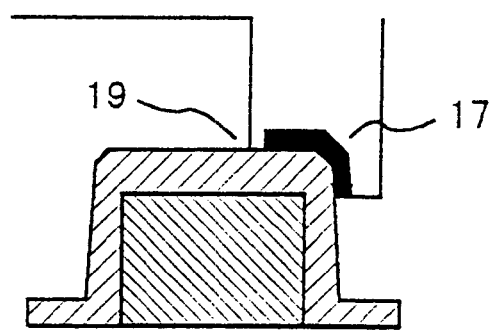

FIGS. 15 through 17 are views for describing a semiconductor device according to a fourth embodiment of the present invention, as well as a method of manufacturing the semiconductor device.

FIG. 15 is a cross-sectional view showing the cross-sectional structure of a semiconductor device, which is represented by DRAM or the like, during manufacturing processes. FIG. 16 is a plan view showing the planar structure of the semiconductor device, and FIG. 15 is taken along broken the line provided in FIG. 16. FIG. 17 is a cross-sectional view for describing etching of the semiconductor device.

The method of manufacturing the device will now be described.

First, the processes as described with reference to FIGS. 2 to 6 in the first embodiment are performed until the interlayer dielectric film 11 shown in FIG. 15 is formed.

In the state shown in FIG. 15, when the contact hole 15 (e.g., a bit line contact hole) is patterned by the opening of the resist pattern 12, the contact hole 15 is patterned so as to extend over the distance between the two gate electrodes 4 (gate or word lines) and to become elongated in the direction of the bit lines 20. In short, the contact hole 15 is formed so as to include part of the horizontal portions of the gate electrodes 4.

So long as the contact hole 15 by the foregoing standards is formed, etching reaches a horizontal portion 19 of the nitride film 8.

Although a deposition is generally unlikely to adhere to a shoulder portion of the nitride film 8, the deposition is apt to adhere to the horizontal portion 19. As shown in FIG. 17, the deposition film 17 is immediately formed on the nitride film 8.

If etching proceeds in this state, a deposition becomes apt to adhere to the shoulder portion of the nitride film 8 when the shoulder of the nitride film 8 is etched, thereby preventing sputter-etching of the nitride film 8. Accordingly, the reliability of a wiring pattern can be improved.

In the fourth embodiment, the opeing of the resist pattern facing a step portion of the silicon nitride film 8 extends to a certain length or more over the upper surface of the silicon nitride film 8.

As shown in FIGS. 15 and 16, a contact hole 15 is formed between the two gate electrodes 4. Preferably, the contact hole 15 extends over the horizontal portion of the silicon nitride film 8 to a length which is 0.1 times the width of the gap between the gate electrodes 4.

Accordingly, in a case where a square contact hole is formed, the side of the hole is set to a length which is 1.2 times the width of the gap between the two gate electrodes 4, in a direction in which the contact hole extends over the gate electrodes. In a case where the shorter side of a rectangular contact hole is set equal to the width of the gap between the two gate electrodes 4, a ratio of the length of the longer side to the length of the shorter side is set to a value of 1.2 or more.

As mentioned previously, according to the fourth embodiment, the contact hole is etched in such a way that the diameter of the contact hole extends over the horizontal portion of the nitride film, thereby preventing sputter-etching of the silicon nitride film and a short circuiting in wiring patterns.

Fifth Embodiment

Figure 18:
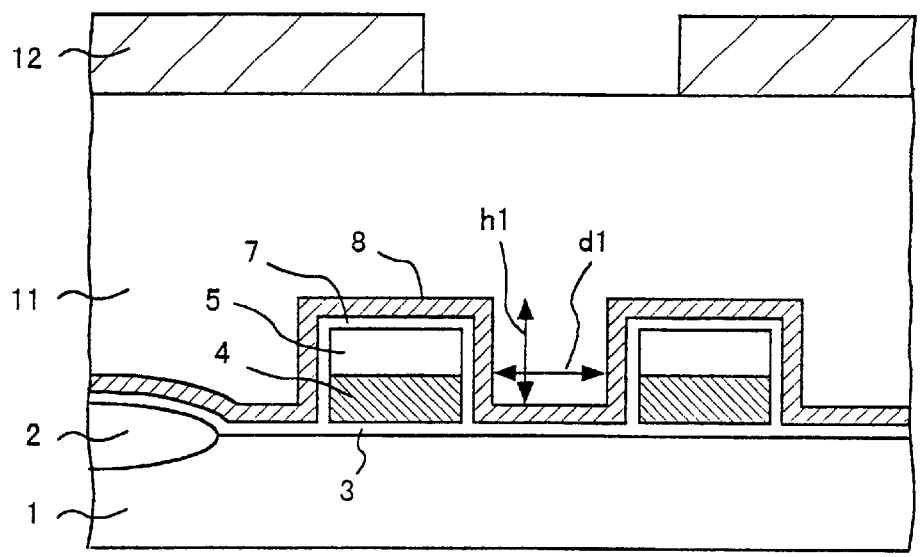
FIGS. 18 and 19 are cross-sectional views showing a method of manufacturing a semiconductor device according to a fifth embodiment of the present invention and the structure of the semiconductor device manufactured thereby.
Figure 19:
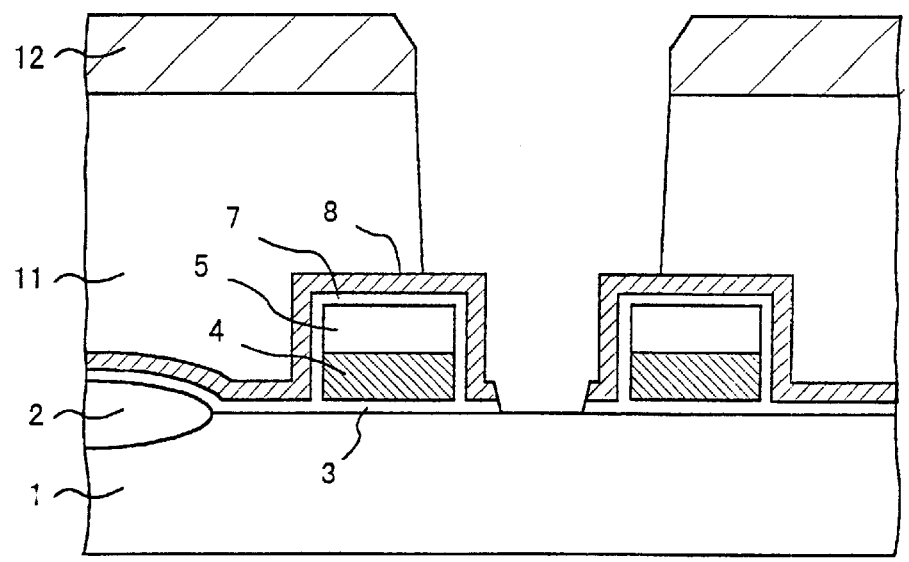

FIGS. 18 and 19 are views for describing a semiconductor device according to a fifth embodiment of the present invention, as well as a method of manufacturing the semiconductor device. FIGS. 18 and 19 are cross-sectional views showing the cross-sectional structure of a semiconductor device, which is represented by DRAM or the like, during manufacturing processes.

The method of forming a self-aligned contact hole will now be described by reference to these drawings.

First, a self-aligned contact hole such as that shown in FIG. 18 is formed by way of the manufacturing processes which have been described in the first embodiment and are shown in FIGS. 2 through 6.

As shown in FIG. 18, the width d1 of the groove or gap to be removed between the gate electrodes 4 is set to a value of 0.2 μm or less, and an aspect ratio h1/d1 is set to a value of 2.5 or more by controlling the groove width d1 between the gate electrodes 4 and the height h1 of the nitride film 8 in the groove. The protective oxide film 5 may be deposited to a greater height to set the aspect ratio at a value of 2.5 or more,.

The interlayer oxide film 11 is anisotropically dry-etched. When etching has proceeded to the bottom of the contact hole, the aspect ratio assumes a high value. As a result, the entry of radicals into the bottom of the contact hole is limited, and only ions are permitted to arrive into the bottom. As a result, the oxide/nitride selectivity is reduced, and, as shown in FIG. 19, the contact hole can be opened directly up to the semiconductor substrate 1.

As mentioned above, according to the fifth embodiment, the contact hole can be opened to reach the semiconductor substrate without additional step to remove the nitride film serving as an etching stopper film after opening of the contact hole, as in the case of formation of a conventional contact hole.

Since the interlayer insulating film and the stopper film provided at the bottom of the contact hole are removed simultaneously, the number of manufacturing processes and cost can be reduced.

Sixth Embodiment

Figure 20:
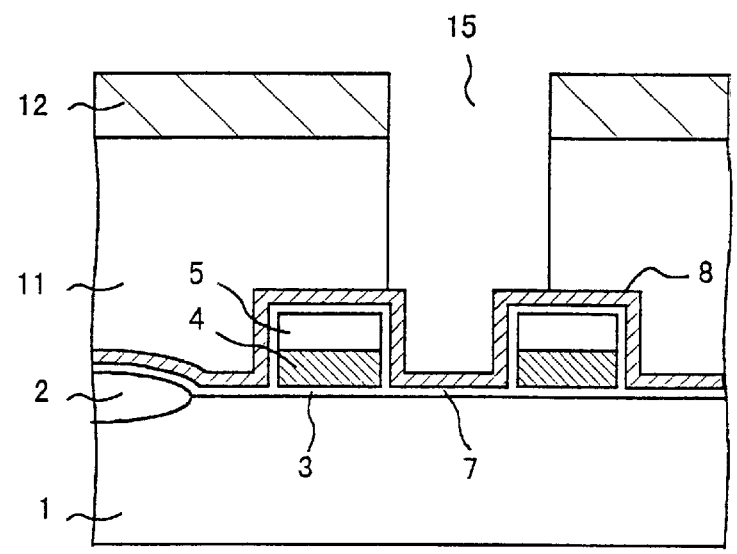
FIG. 20 is a cross-sectional view showing a method of manufacturing a semiconductor device according to a sixth embodiment of the present invention and the structure of the semiconductor device manufactured thereby.

FIG. 20 is a view for describing a semiconductor device according to a sixth embodiment of the present invention, as well as a method of manufacturing the semiconductor device. FIG. 20 is a cross-sectional view showing the cross-sectional structure of a semiconductor device, which is represented by DRAM or the like, during manufacturing processes.

As shown in FIG. 20, in the sixth embodiment, a $SiO_xN_y$ film is used as the etching stopper film 8 in lieu of a commonly-used silicon nitride film.

The $SiO_xN_y$ film is more analogous to Si than a silicon nitride film.

When the $SiO_xN_y$ film is subjected to a heat treatment, the film is transformed more analogous to Si. The heat treatment is conducted by a furnace annealing at 800° C. or more for 20 minutes or more.

Si is less likely to be etched in an etching gas for an oxide film. As mentioned previously, so long as the stopper film becomes analogous to Si, a sufficient oxide/silicon etching selectivity can be ensured.

The wafer is etched through use of a high-density plasma etching system such as ECR or ICP, as well as by use of a $C_4F_8/CH_2F_2/Ar/O_2$ mixed gas. The deposition caused by the $C_4F_8$ gas and the $CH_2F_2$ gas protects the $SiO_xN_y$ film provided below the oxide film from etching. Since the stopper film is analogous to Si, etching is less likely to proceed in this gas atmosphere.

As mentioned above, so long as the $SiO_xN_y$ film is used as a stopper film and is subjected to a heat treatment, there can be ensured a sufficient oxide/stopper film selectivity.

As mentioned above, according to the sixth embodiment, a film having a higher selectivity can be used as the stopper film. Accordingly, a self-aligned contact hole can be opened by means of a self-alignment technique without involving short-circuiting.

Seventh Embodiment

FIGS. 21 to 27 are views for describing a semiconductor device according to a seventh embodiment of the present invention, as well as a method of manufacturing the semiconductor device.

The seventh embodiment is directed to manufacture of the self-aligned contact hole described in the first embodiment as shown in FIG. 1, under a method differing from those of the previous embodiments.

A method of manufacturing a self-aligned contact hole according to the seventh embodiment will now be described by reference to the drawings.

First, a wafer is subjected to the manufacturing processes described in the first embodiment with reference to FIGS. 2 through 5.

Figure 21:
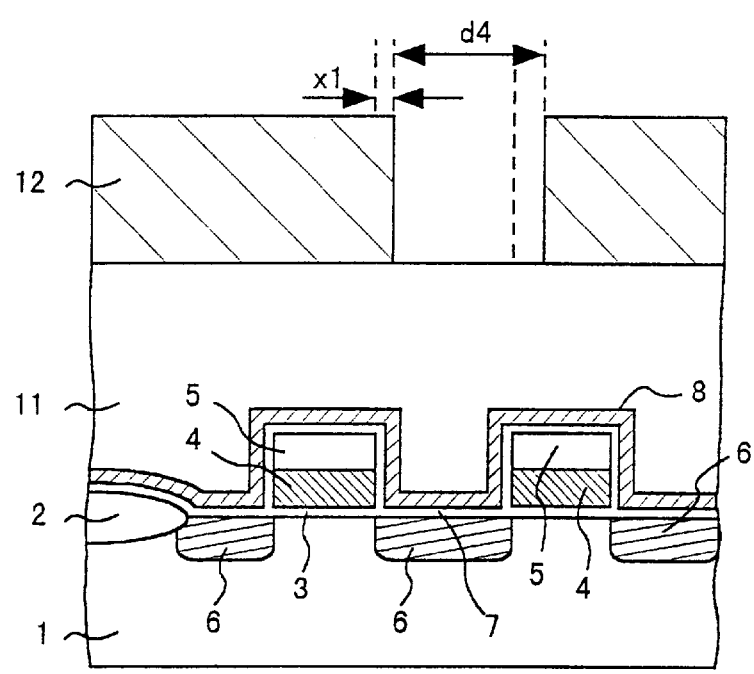
FIGS. 21 through 24 are cross-sectional views showing a method of manufacturing a semiconductor device and the structure thereof according to a seventh embodiment of the present invention.

As shown in FIG. 21, the resist pattern 12 to be used for forming a predetermined contact hole is formed on the interlayer oxide film 11. To form a contact hole by means of the self-alignment technique, the opening diameter d2 of the resist pattern 11 is formed so as to become larger than a contact hall diameter. FIG. 21 shows a miss-alignment x1 between the resist pattern 12 and the gate electrode 4 provided below the resist pattern 12. In some cases, an organic reflection prevention film may be deposited below the resist pattern. There will now be described the resist pattern which does not include any lower reflection prevention film.

Figure 22:
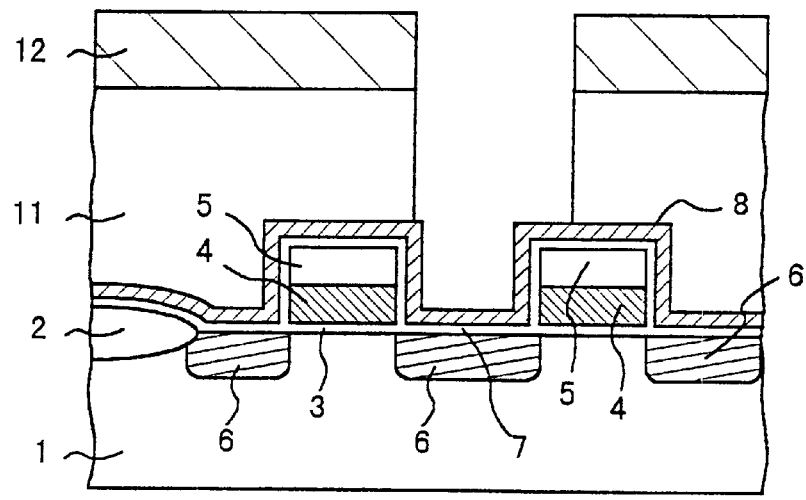

As shown in FIG. 22, the interlayer oxide film 11 is dry-etched at a high nitride/oxide etch selectivity (ratio) (a selectivity of greater than 25) until the nitride film 8 becomes exposed while the resist pattern 12 is used as a mask.

One example of etching conditions is as follows:

Gas: $C_3F_6$=16 sccm, Ar=150 sccm, $CH_2F_2$=10 sccm,

Pressure: 1Pa, Source Power=1,200W, Bias Power=1,400W

Commercially available Centura© HDP dielectric Etch System (manufactured by Applied Materials Co., Ltd.) was used in this embodiment.

When the interlayer oxide film 11 is etched under the foregoing conditions, a nitride/oxide etch selectivity (ratio) of greater than 25 is ensured. Thereby, the entire nitride film 8, which covers the gate electrodes 4 and appears in the contact hole, will not be removed.

In the seventh embodiment, it is important that a $C_3F_6$ gas be used in place of a $C_4F_8$ gas as described in Japanese Patent Application Laid-open No. Hei-7-161702.

Figure 25:
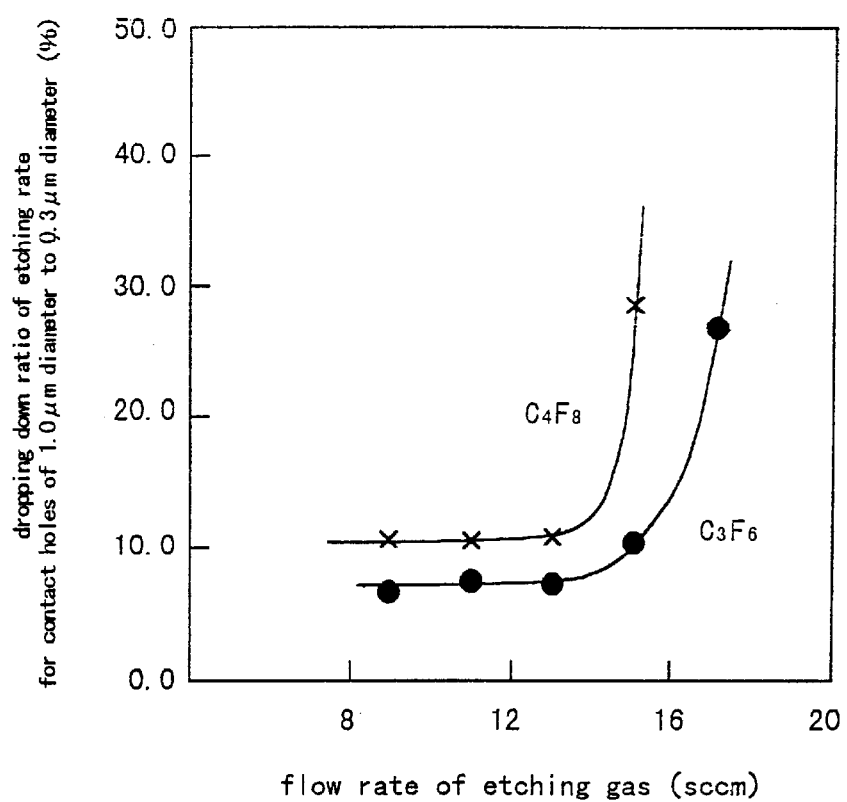
FIGS. 25 through 27 are graphs for explaining the semiconductor device manufacturing method according to the seventh embodiment.

FIG. 25 is a graph showing a dropping rate of etching rate of the etching gases corresponding to change of flow rate of the etching gases. As shown in FIG. 25, although the $C_4F_8$ gas and the $C_3F_6$ gas have an identical C/F ratio, their etching rate shows different dropping down ratio from a contact hole of 1.0 μm diameter to a contact hole of 0.3 μm diameter. In short, the $C_3F_6$ gas shows a smaller reduction in etching rate. This characteristic is important, because it affects the manufacturing yield of a semiconductor element or the amount of required over-etching.

Figures 26, 27:
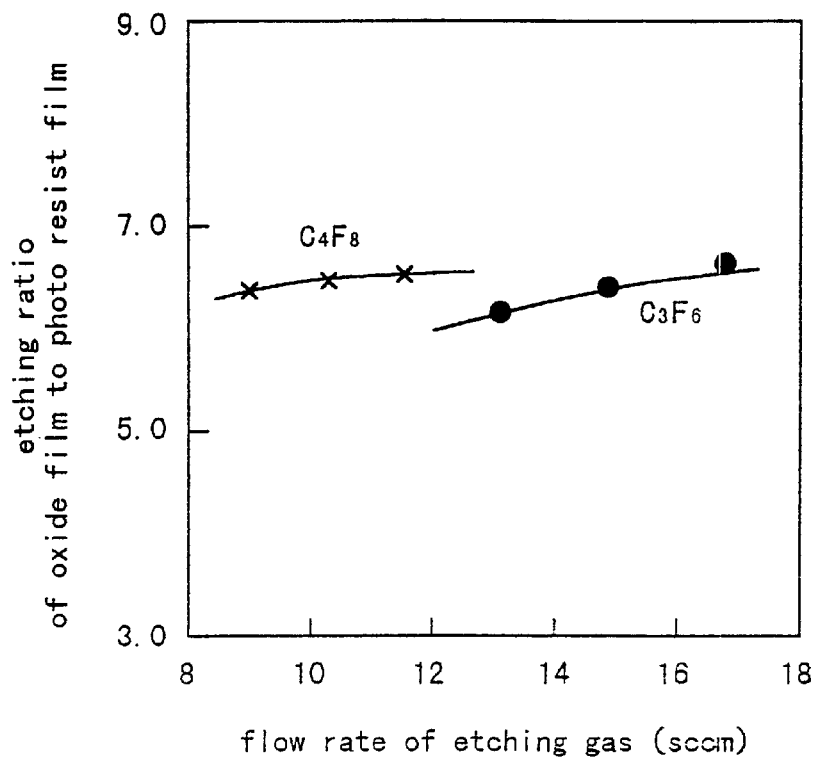

FIG. 26 is a graph showing a ratio of etching rate of the etching gases corresponding to change of flow rate of the etching gases. As shown in FIG. 26, the $C_4F_8$ gas and the $C_3F_6$ gas shows substantially same selectivity ratio for a photoresist. Due to the difference in the absolute amount of C included in the $C_4F_8$ gas and the $C_3F_6$ gas, the $C_3F_6$ gas shows slightly lower selectivity. However, such a difference in selectivity does not pose a problem in manufacturing a semiconductor device. Accordingly, as shown in FIG. 27, a drop ratio in etching rate can be maintained within 10% when a selectivity of greater than 25 is maintained at a tapered portion of the nitride film.

Figure 23:
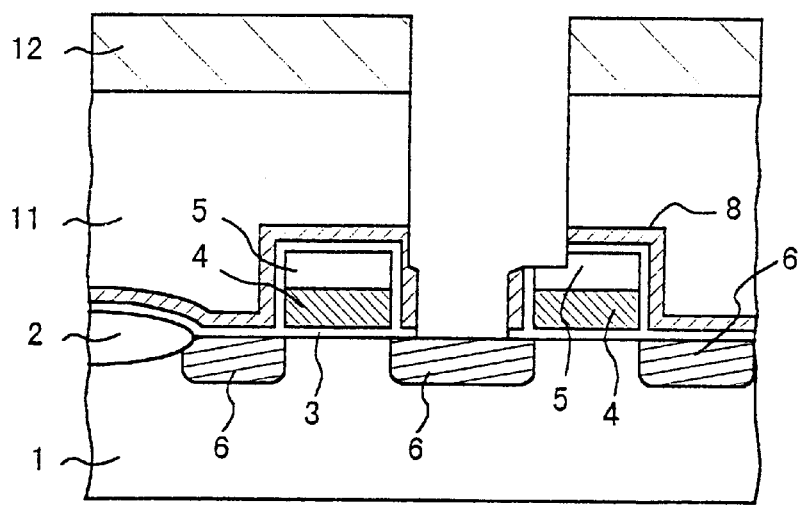

Next, as shown in FIG. 23, the resist pattern is removed by a resist removing apparatus. Further, the nitride film 8 and the thin-film oxide film 7 are etched until the bottom of the contact hall becomes exposed under dry etching conditions in which the nitride/oxide etch selectivity (ratio) becomes low (assumes a value of, e.g., 0.2), through use of the gas such as $CH_2F_2$ as described in Japanese Patent Publication No. Hei-6-12765.

Figure 24:
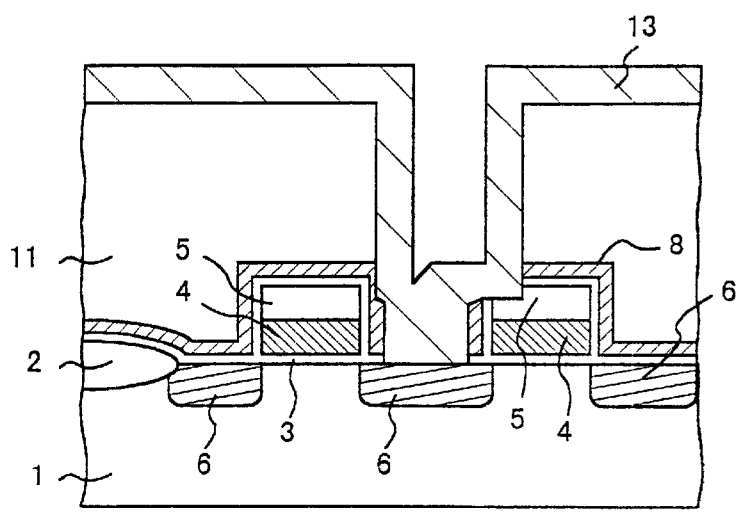

Thereafter, the bit line electrodes 20 are formed as shown in FIG. 24.

As mentioned above, according to the seventh embodiment, an interlayer film/stopper film etch selectivity can be improved by means of the added gas.

As a result, in a case where a self-alignment technique is used, a minute contact hole having superior dimensional stability can be formed without sacrificing electrical characteristics. There is achieved an improvement in the degree of integration of a semiconductor device, as well as improvement in the manufacturing yield and reliability of a semiconductor device, without involvement of a short circuiting between gate electrodes.

Eighth Embodiment

FIGS. 21 to 27 are views for describing a semiconductor device according to an eighth embodiment of the present invention and a method of manufacturing the semiconductor device, as in the case of the seventh embodiment.

The eighth embodiment is directed to manufacture of the self-aligned contact hole as described in the first embodiment with reference to FIG. 1, under a method differing from those of the previous embodiments.

A method of forming a self-aligned contact hole according to the eighth embodiment will now be described with reference to the drawings.

First, a wafer is subjected to the procedures described in the first embodiment with reference to FIGS. 2 through 5. Subsequently, the wafer is subjected to the process described in the seventh embodiment with reference to FIG. 21.

Then, as shown in FIG. 22, the interlayer oxide film 11 is dry-etched at a high nitride/oxide etch selectivity (ratio) (a selectivity of greater than 25) until the nitride film 8 becomes exposed, while the resist pattern 12 is used as a mask.

One example of etching conditions is as follows:

Gas: $CF_3COFHCF_3$=18 sccm, Ar=150 sccm, $CH_2F_2$=10 sccm,

Pressure: 1Pa, Source Power =1,200W, Bias Power=1,400W

Since the $CF_3COFHCF_3$ gas contains oxygen atoms, the gas prevents a deposition from adhering to the inside of the contact hole inexcessive amounts. Accordingly, when compared with a $C_4F_8$ gas, the $CF_3COFHCF_3$ gas shows a smaller decrease in etching rate between a contact hole of 0.3 μm diameter and a contact hole of 1.0 μm diameter.

This characteristic is important, because it affects the manufacturing yield of semiconductor device or the amount of over-etching required. Accordingly, the oxide/nitride etching selectivity can be increased at the tapered portion of the nitride film without reducing the ratio in etching rate. Therefore, a contact hole can be formed without reducing the thickness of an insulating film surrounding a gate electrode.

As mentioned above, according to the eighth embodiment, the wafer is subjected to plasma etching through use of a mixed gas formed by adding a $CF_3COFHCF_3$ gas to a rare gas such as an Ar gas, and a selectivity ratio between an interlayer film and a stopper film can be improved.

As a result, in a case where a self-alignment technique is used, a minute contact hole having superior dimensional stability can be formed without electrical characteristics being compromised. There is achieved an improvement in the degree of integration of a semiconductor device, as well as in the manufacturing yield and reliability of a semiconductor device without involvement of a short circuiting of the gate electrodes.

Ninth Embodiment

FIGS. 28 through 32 are views for describing a semiconductor device according to a ninth embodiment of the present invention and a method of manufacturing the semiconductor device, as in the case of the seventh embodiment.

Figure 28:
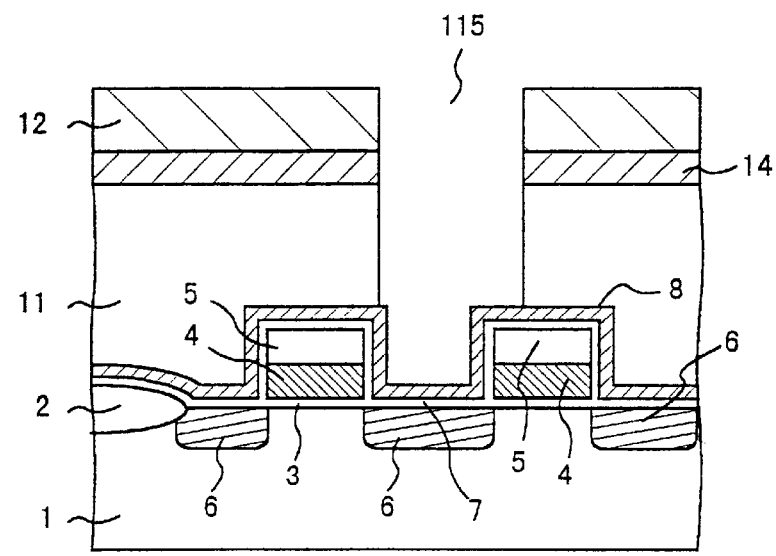
FIGS. 28 through 30 are cross-sectional views showing a method of manufacturing a semiconductor device and the structure thereof according to an eighth embodiment of the present invention.

FIG. 28 shows a cross-sectional structure of a semiconductor device, represented by DRAM, during manufacturing processes. The semiconductor device shown in FIG. 28 is substantially identical in structure with that shown in FIG. 1. Like reference numerals designate like elements, and repeated explanations thereof will be omitted. In FIG. 28, reference numeral 14 designates a reflection prevention film formed from organic material on the oxide film 11; and 12 designates a photoresist which is formed on the reflection prevention film 14 and which is patterned in a desired position.

A series of continual processes for manufacturing the semiconductor device having the foregoing construction will now be described.

First, the wafer is subjected to the manufacturing processes described in the first embodiment with reference to FIGS. 2 through 5.

Figure 29:
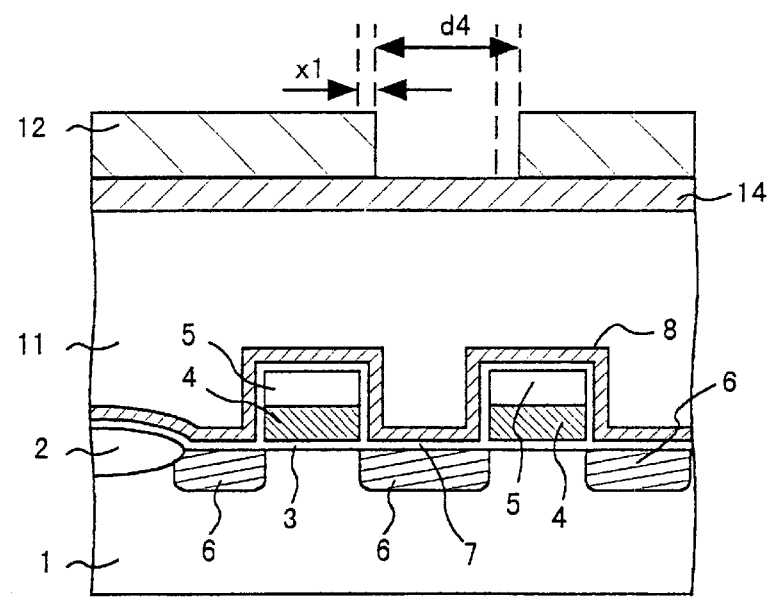

As shown in FIG. 29, the organic reflection prevention film 14 is deposited on the interlayer oxide film 11 in a process subsequent to the process shown in FIG. 5. The resist pattern 12 to be used for forming a predetermined contact hole is formed on the interlayer oxide film 11. To form a contact hole by means of the self-alignment technique, the resist pattern is formed to have a hole dimension d2 which is larger than a contact portion of a diameter d1. FIG. 29 shows a misalignment x1 between the resist pattern 12 and the gate electrode 4 provided below the resist pattern 12.

Figure 30:
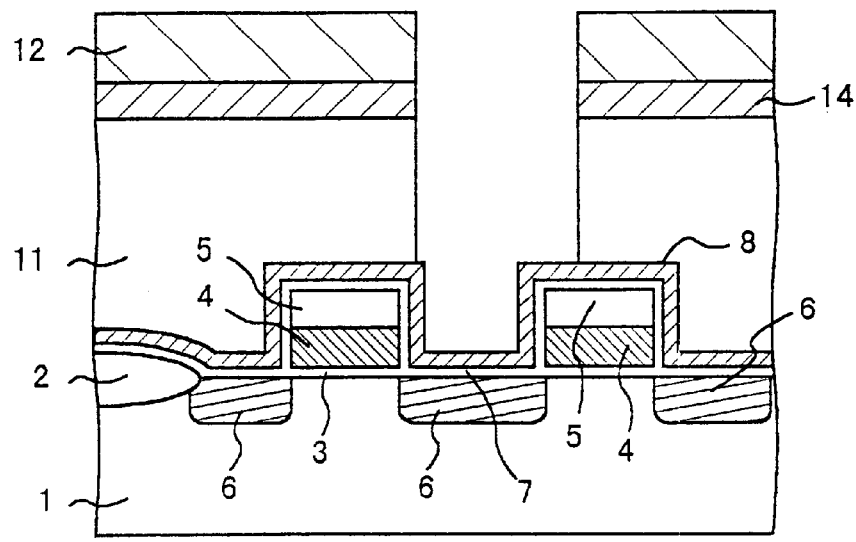
Figure 31:
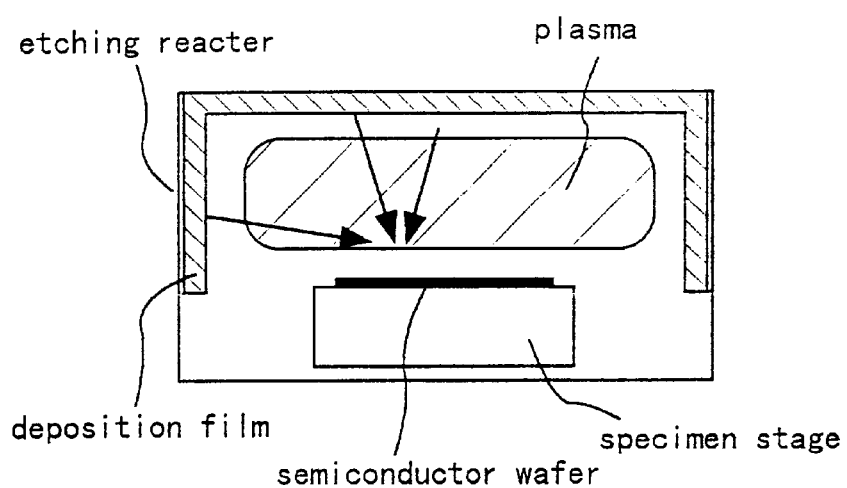
FIGS. 31 through 33 are schematic representations or a graph for explaining the semiconductor device manufacturing method according to the eighth embodiment.

As shown in FIG. 30, the organic reflection prevention film 14 and the interlayer oxide film 11 are removed in a continual manner by means of dry etching within the same processing chamber. Due to the successive processing in the same system, the number of processes and manufacturing cost can be reduced.

Since the material of the stopper film 8 differs from that of the organic reflection prevention film 14 and that of the interlayer oxide film 11, the film 8 is etched away under suitable conditions. More specifically, a step of etching the stopper film 8 is separated from a step of etching the reflection prevention film 14 and the interlayer oxide film 11.

In the step of etching the reflection prevention film 14, an organic material is etched. Therefore, the organic reflection prevention film 14 is usually etched at a higher rate through use of an oxygen-containing gas such as that described in Japanese Patent Application Laid-open No. Hei-9-120963.

At this time, if the etching conditions are set under which the etching rate of organic reflection prevention film 14 assumes a value of 150 nm/min or more, or under which a selectivity ratio between the organic reflection prevention film and a resist assumes a value greater than 1, i.e., (an organic reflection prevention film/resist selectivity)>1, then the deposition film adhering to the internal wall of a processing chamber (reactor) is exfoliated and adheres to the semiconductor device, thus deteriorating manufacturing yield.

Figure 33:
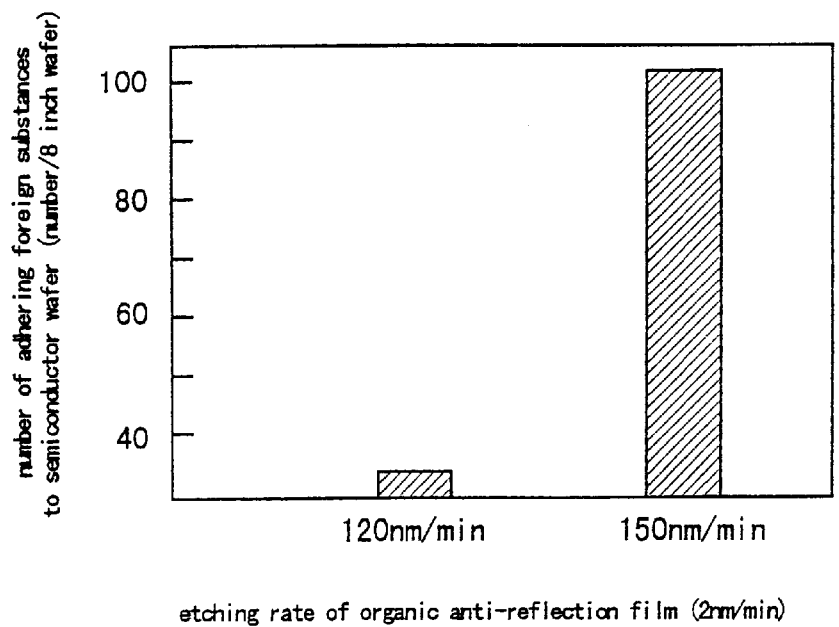
Figure 34:
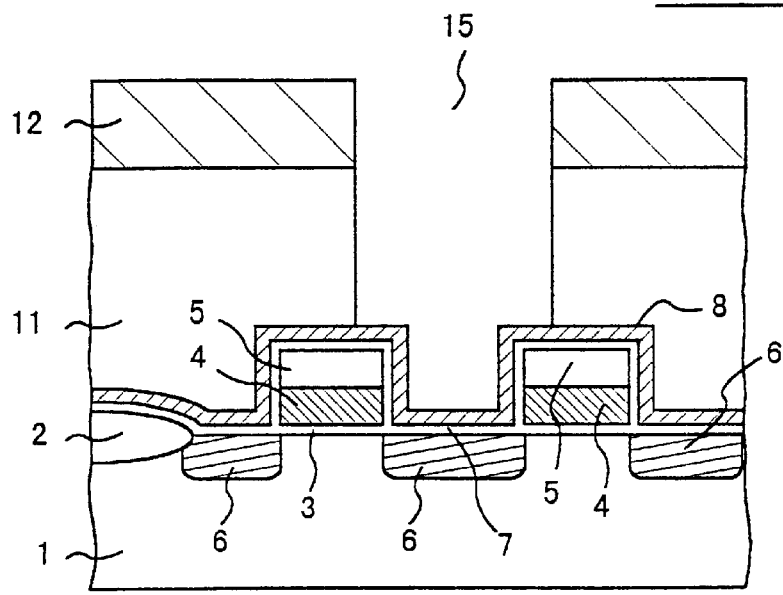
FIGS. 34 through 39 are cross-sectional views showing a structure of a semiconductor device using a conventional self-aligned contact hole.
Figure 35:
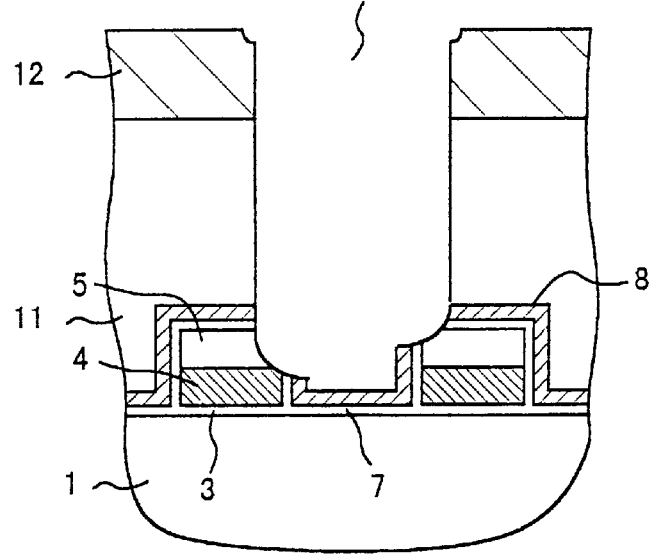
Figure 36:
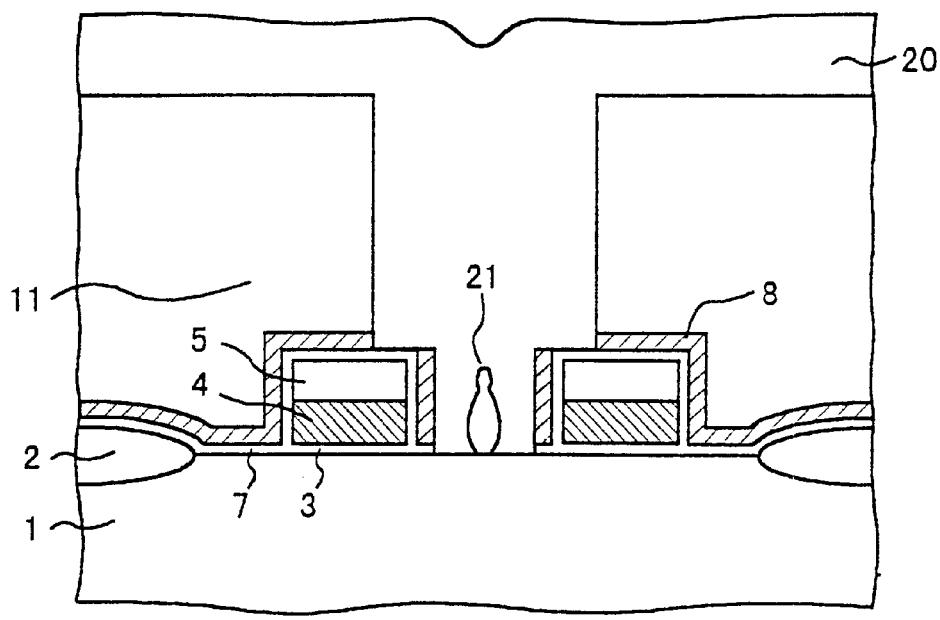
Figure 37:
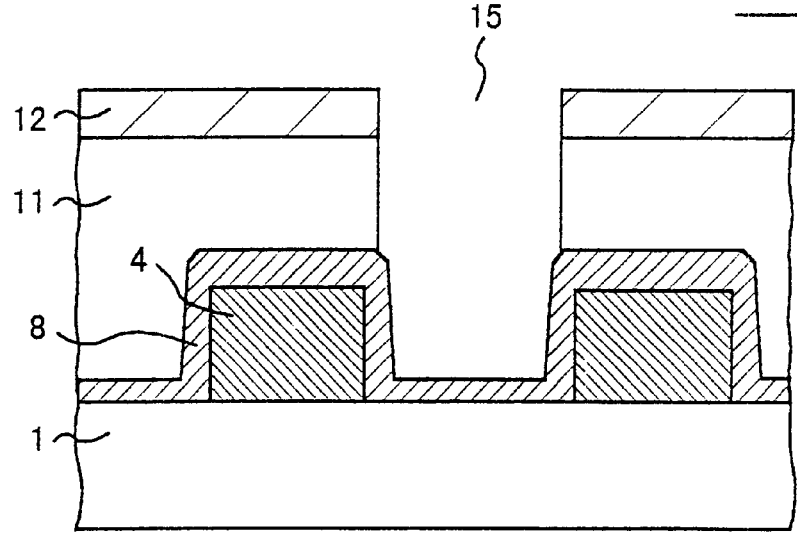
Figure 38:
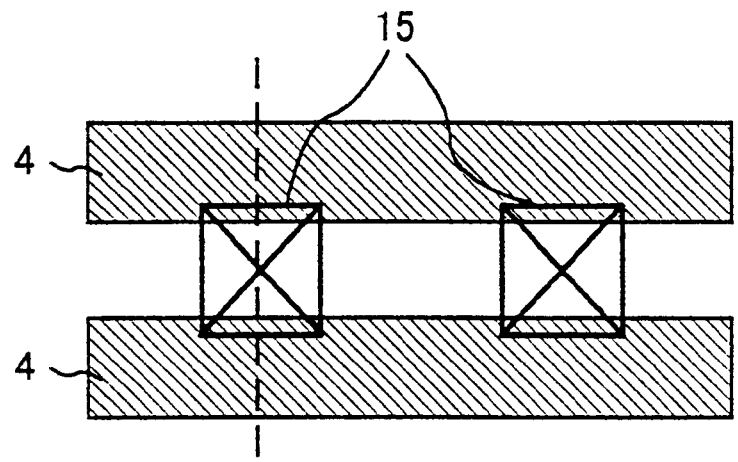
Figure 39:
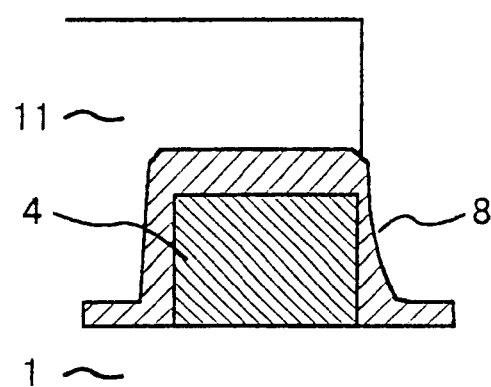

FIG. 33 shows an example of such etching. FIG. 33 shows a relationship between the etching rate of organic reflection prevention film and the amount of deposition adhering to a semiconductor substrate. The drawing shows that exfoliation of the deposition film from the internal wall of the reactor can be prevented by reducing the etching rate, thus permitting processing of the semiconductor substrate without involvement of adhesion of foreign substances.

Accordingly, the exfoliation of the deposition film from the internal wall of the reactor can be prevented by setting the etching condition under which the etching rate of organic reflection prevention film 14 assumes a value of less than 150 nm/min, preferably a value ranging from 50 nm/min to less than 150 nm/min, or conditions under which an etching selectivity between the organic reflection prevention film and the resist assumes a value of lower than 1, i.e., (an etching rate of organic reflection prevention film/an etching rate of resist)<1, preferably a value ranging from 0.3 to less than 1.

In the present embodiment, to accomplish the foregoing conditions, the etching rate is reduced by adding a deposit-type gas such as $CF_4$ or $C_4F_8$ gas to an oxygen gas. In a case where an ICP etching system is used, an exemplified amount of $CF_4$ gas to be added is 5 to 40 sccm, and an exemplified amount of $C_4F_8$ gas to be added is 5 to 10 sccm.

Figure 32:
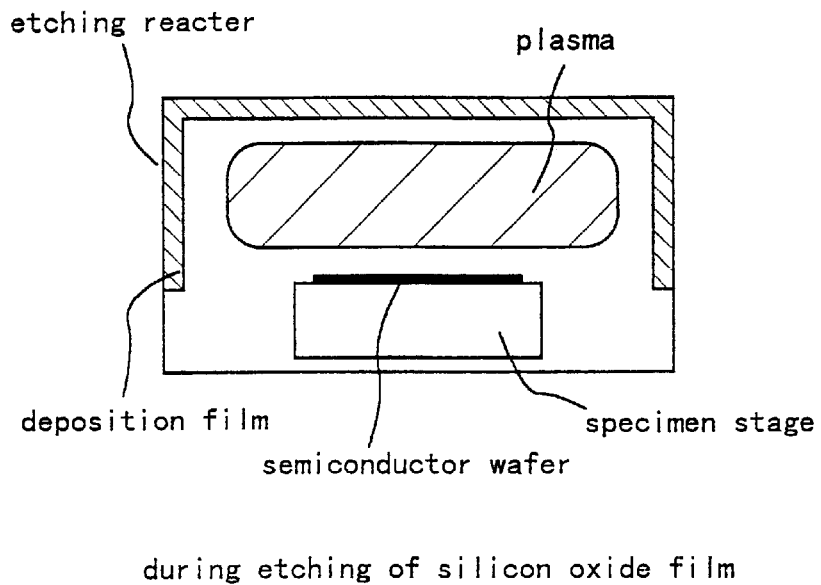

Such a phenomenon is noticeable at the time of formation of a self-aligned contact hole. The reason for this is that since the interlayer oxide film is etched at a high oxide/$Si_3N_4$ etching selectivity, which in turn causes large depositions as described in Japanese Patent Application Laid-open Nos. Hei-7-161702 or Hei-9-50986, a deposition film is apt to be deposited on the internal wall of the reactor, as shown in FIG. 32.

Thereafter, the resist pattern 12 is removed by means of a resist removing apparatus. At this time, the organic reflection prevention film 14 can also be removed simultaneously. Since a step subsequent to this step is identical with that described in the previous embodiments, its explanation is omitted.

As mentioned above, according to the present embodiment, a deposition film is prevented from adhering to the internal wall of a processing chamber by reducing a rate at which an organic reflection prevention film is etched. More specifically, a minute contact hole having superior dimensional stability can be formed by means of the self-alignment technique without electric characteristics being compromised, so long as the etching conditions are set under which the etching rate of organic reflection prevention film assumes a value of less than 150 nm/min or conditions under which an etching selectivity between the organic reflection prevention film and the resist assumes a value lower than 1. Further, imperfections in a semiconductor substrate caused by foreign substances can be reduced, thereby resulting in an improvement in the degree of integration of a semiconductor device. Further, manufacturing yield and reliability of a semiconductor device are improved without involvement of a short circuiting of the gate electrode.

For reference, the present embodiment may be summarized as follows. In the present embodiment, a semiconductor device includes a silicon oxide film formed on an underlying film on a semiconductor substrate; an organic reflection prevention film formed on the silicon oxide film; and a resist mask formed on the organic reflection prevention film, the resist mask having an opening at a predetermined position. In the method of manufacturing the semiconductor device, the organic reflection prevention film is etched through said opening of said resist mask at an etching rate of lower than 150 nm/min.

Alternatively, in the method of manufacturing the semiconductor device, the organic reflection prevention film is etched through said opening of said resist mask under the condition that an etching selectivity ratio of the organic reflection prevention film to the resist mask is less than one.

In another aspect, in the method, the organic reflection prevention film is etched by means of plasma etching through use of a $CF_4$ or $C_4F_8$, gas added to an oxygen-containing gas.

Under the semiconductor device manufacturing method according to the present embodiment, an organic reflection prevention layer provided below a resist pattern is etched at a lower rate, thereby preventing exfoliation of a deposition film from the internal wall of a processing chamber. As a result, a failure in a semiconductor substrate caused by foreign substances can be reduced, thus enabling an improvement in manufacturing yield and reliability of a semiconductor device.

Tenth Embodiment

A semiconductor device and a method of manufacturing the device according to a tenth embodiment of the present invention will now be described with reference to FIGS. 4, 5, and 28.

As shown in FIG. 4, in a case where a self-aligned contact is used when forming a semiconductor device, the silicon nitride film 8 is deposited after formation of a gate conductive layer.

The thickness of the silicon nitride film 8 is set by means of a nitride film selectivity ratio used in a subsequent step, i.e., at the time of etching of a contact hole. The thickness is set to about 100 to 500 Å.

The interlayer oxide film 11 is deposited on the silicon nitride film 8. Subsequently, as shown in FIG. 5, the oxide film 11 is smoothed.

Thereafter, as shown in FIG. 28, in order to form a high-precision minute hole, the organic reflection prevention film 14 is used at the time of patterning of the resist 11.

When the contact hole is formed in the semiconductor substrate 1, the oxide film 11 must be etched selectively with respect to the nitride film 8 after the organic reflection prevention film 14 has been processed.

At this time, the organic film is etched in an oxygen-containing gas through use of high-density plasma such as ICP or ECR which enables minute processing. Subsequently, the processing is switched to a step of etching the oxide film 11 through use of a gas having a low C/F ratio such as a $C_4F_8$ gas.

As mentioned previously, the etching processes comprises two steps; the one step at which a deposition is formed in small amounts with a low selectivity ratio (i.e., a step of etching an organic film) and the other step at which a deposition is formed in large amounts with a high selectivity ratio (i.e., a step of etching an oxide film). In an apparatus which produces high density plasma, a wafer is processed on a per-sheet basis. Accordingly, the second wafer and subsequent wafers are processed through cycles of high and low deposition steps. As a result, a deposition adheres to the wall of the processing chamber, and the thus-adhering deposition is exfoliated, thereby generating dust in the chamber.

As a measure to prevent dust, each time a wafer is etched, the processing chamber is cleaned. The wafer is cleaned under an oxygen-rich gas atmosphere for a period of time during which the amount of foreign substances becomes stable while bias power is set in consideration of a reduction in the thickness of a shoulder portion of the nitride film provided along a gate electrode.

As mentioned above, according to the tenth embodiment, dust is prevented from arising in the processing chamber, thus enabling a reduction in the amount of foreign substance adhering to a device. Accordingly, pattern failures caused by dust are prevented, and system throughput and the electric characteristics of a semiconductor device can be improved.

For reference, the present embodiment may be summarized as follows. In the present embodiment, a semiconductor device includes a silicon oxide film formed on an underlying film on a semiconductor substrate; an organic reflection prevention film formed on the silicon oxide film; and a resist mask formed on the organic reflection prevention film, the resist mask having an opening at a predetermined position thereon. In the method of manufacturing the semiconductor device, the semiconductor substrate is processed by plasma-etching the organic reflection prevention film and by plasma-etching the silicon oxide film through said opening within a processing chamber. Further, the processing chamber is subjected to cleaning discharge after completion of processing of the semiconductor substrate, thereby removing organic depositions adhering to the processing chamber.

Under the semiconductor device manufacturing method according to the present embodiment, a processing chamber is subjected to cleaning discharge after completion of processing of one semiconductor substrate and before processing another semiconductor substrate, thus removing organic depositions adhering to the processing chamber. As a result, dust and pattern failures caused by dust are prevented, thus enabling an improvement in manufacturing yield and reliability of a semiconductor device.

Finally, the effects and advantages of the present invention may be summarized as follows.

According to the present invention, when a contact hole is formed by means of a self-alignment technique, prevented is a progress of etching of an etching stopper film which protects a conductive section such as a gate electrode, and also prevented is a deterioration of electric characteristics of a contact hole. Thus, the manufacturing yield and reliability of a semiconductor device are improved.

Further in detail, the present invention yields the following advantageous results:

Under a semiconductor device manufacturing method according to the present invention, a shoulder of a step of a silicon nitride film in a contact hall may be tapered by etching a silicon oxide film through an opening of a resist mask by means of plasma etching in a mixed gas including a rare gas and a CF-based gas. As a result, a tapered angular portion is formed at the bottom of the contact hole, thus preventing a filling failure.

Under a semiconductor device manufacturing method according to the present invention, a silicon oxide film and a step of a silicon nitride film provided blow the oxide film may be etched through an opening of a resist mask by means of plasma etching which employs a mixture of a $CH_2F_2$ gas and a mixed gas including a rare gas and a $C_4F_8$ gas. By means of the added gas, the silicon oxide film (i.e., an interlayer dielectric film) and the silicon nitride film (i.e., an etching stopper film) can be etched simultaneously, thus reducing the number of manufacturing processes and manufacturing cost and resulting in an improvement in manufacturing yield.

Further, when a contact hole lies on only one of gate electrodes as a result of a miss-alignment at the time of photolithography of the contact hole, the stopper film provided at the bottom of the contact hole is etched at the time of forming the contact hole, thus enabling easy removal of a stopper film from the bottom of the contact hole in a subsequent step.

Under a semiconductor device manufacturing method according to to the present invention, a contact hole (SAC hole) in a semiconductor substrate may be formed simultaneously with formation of a contact hole for a conductor such as a gate, thereby enabling a significant reduction in the number of manufacturing processes and manufacturing cost.

Under a semiconductor device manufacturing method according to the present invention, a silicon oxide film may be etched through an opening of a resist mask in such a way that the contact hole extends by a required amount over a horizontal portion of a silicon nitride film which is continuing the bottom of the contact hole. As a result, there can be prevented sputter-etching of a silicon nitride film and a short circuiting between wiring patterns.

Under a semiconductor device manufacturing method according to the present invention, when a silicon oxide film is etched through an opening of a resist mask so as to form a contact hole in a slit of the nitride film at the bottom of the contact hole, an aspect ratio A/B of the slit of the silicon nitride film is set to a value of 2.5 or more. Accordingly, the silicon oxide film (i e., an interlayer dielectric film) and the silicon nitride film (i.e., a stopper film) provided at the bottom of the contact hole can be removed simultaneously. Therefore, the number of manufacturing processes and manufacturing cost can be significantly reduced.

Under a semiconductor device manufacturing method according to the present invention, when a silicon oxide film is etched through an opening of a resist mask and a contact hole is formed along an etching stopper film provided at the bottom of the contact hole, a $SiO_xN_y$ film is used as the etching stopper film. Accordingly, a film having a considerably high selectivity ratio can be used as the etching stopper film, and exfoliation of the etching stopper film can be prevented.

Under a semiconductor device manufacturing method according to the present invention, a silicon oxide film (i.e., an interlayer dielectric film) is etched through an opening of a resist mask by means of plasma etching, through use of a mixed gas including a rare gas and either a $C_3F_6$ or a $CF_3$—O—$CFHCF_3$ gas. By means of the added gas, a selectivity ratio between the silicon oxide film (i.e., an interlayer dielectric film) and an etching stopper film (i.e., a silicon nitride film) can be improved, thus preventing exfoliation of the etching stopper film.

Obviously many modifications and variations of the present invention are possible in the light of the above teachings. It is therefore to be understood that within the scope of the appended claims the invention may by practiced otherwise than as specifically described.

What is claimed is:

1. A method of manufacturing a semiconductor device, comprising the steps of:
    forming a resist mask on a silicon oxide film a laid on a silicon nitride film having a step portion on a semiconductor substrate, in such a way as to have an opening above said step portion; and
    etching the silicon oxide film through said opening of the resist mask, by means of plasma eching through use of a processing gas comprising a mixture of a rare gas and a CF-based gas, thereby tapering the shoulder of said step portion of said silicon nitride film,
    wherein a $C_4F_4$ gas is used as said CF-based gas.

2. The method of manufacturing a semiconductor device as defined in claim 1, wherein a $CH_2F_2$ gas is added to said mixed gas including a rare gas and a $C_4F_8$ gas.

3. The semiconductor device manufacturing method as defined in claim 2, wherein a ratio of the rare gas and the $CH_2F_2$ gas is adjusted according to the height of said step portion of said silicon nitride film.

4. The method of manufacturing a semiconductor device as defined in claim 2, further comprising the steps of:
    forming another opening in said resist mask above a silicon conductive film which is disposed under said silicon nitride film;
    etching said silicon oxide film and said silicon nitride film through said opening, thereby forming a hole reaching said silicon conductive film.

5. A method of manufacturing a semiconductor including a silicon oxide film formed on an underlying layer on a semiconductor substrate, the method comprising the steps of:
    forming on said silicon oxide film a resist mask having an opening formed at a location thereon; and
    etching said silicon oxide film through said opening of the resist mask to form a hole reaching said silicon nitride film, by means of plasma etching through use of a gas including a rare gas and a $C_3F_6$ gas or $CF_3$+–$CFHCF_3$ gas.

6. A method of manufacturing a semiconductor device, comprising the steps of:
    forming a groove in an underlying film on a substrate;
    forming a silicon nitride film on the surface of said underlying film including the surface of said groove, thereby forming a groove structure of said silicon nitride film;
    forming a silicon oxide film on said silicon nitride film;
    forming a resist mask on said silicon oxide film in such a way as to have an opening above said groove of said silicon nitride film, said opening having a diameter larger than the width of said groove; and
    etching said silicon oxide film through said opening of said resist mask, by means of plasma etching through use of a processing gas comprising a mixture of a rare gas and a CF-based gas, thereby tapering the shoulder portion of said groove of said silicon nitride film, wherein the CF-based gas is selected from the group consisting of $C_3F_6$, $C_4F_4$, $CF_3$—O—$CFHCF_3$ and a mixture of $C_4F_8$ and $CH_2F_2$.

7. The method of manufacturing a semiconductor device as defined in claim 6, further comprising the step of:
    anisotropically etching said silicon nitride film through said opening by means of plasma etching through use of a mixed gas including $Cl_2$ and HBr.

8. The method of manufacturing a semiconductor device as defined in claim 6, further comprising the steps of:
    forming another opening in said resist mask above a silicon conductive film which is disposed under said silicon nitride film;
    etching said silicon oxide film and said silicon nitride film through said opening, thereby forming a hole reaching said silicon conductive film.

9. A semiconductor device manufactured by the semiconductor device manufacturing method as defined in claim 6.

10. The method of manufacturing a semiconductor device as defined in claim 6, wherein said semiconductor device includes said silicon nitride film formed on an underlying film on a semiconductor substrate, said silicon nitride film having a step portion for forming a groove with a width and height, and said silicon oxide film formed on said silicon nitride film, and the method comprising the steps of:
    forming said resist mask on said silicon oxide film so as to have said opening above said step portion of said silicon nitride film; said opening being formed to extend on the upper surface of said step portion of said silicon nitride film by at least 0.1 times the width of said groove; and
    etching said silicon oxide film through said opening.

11. The method of manufacturing a semiconductor device as defined in claim 6, comprising the step of:
    forming said etching stopper film on an underlying layer on said semiconductor substrate, said etching stopper film being formed as to have a groove with a width of less than 0.2 $\mu$m and height of not less than 2.5 times of said width.

12. A method of manufacturing a semiconductor device, comprising the steps of:
    forming a resist mask on a silicon oxide film laid on a silicon nitride film having a step portion on a semiconductor substrate, in such a way as to have an opening above said step portion; and
    etching the silicon oxide film through said opening of the resist mask, by means of plasma etching through use of a processing gas comprising a mixture of a rare gas and a CF-based gas selected from the group consisting of $C_3F_6$, $C_4F_4$, $CF_3$—O—$CFHCF_3$ and a mixture of $C_4F_8$ and $CH_2F_2$, thereby tapering the shoulder of said step portion of said silicon nitride film
    wherein said semiconductor device includes said silicon nitride film formed on an underlying film on a semiconductor substrate, said silicon nitride film having a step portion for forming a groove with width and height, and said silicon oxide film formed on said silicon nitride film, and the method comprising the steps of:
  forming said resist mask on said silicon oxide film so as to have said opening above said step portion of said silicon nitride film; said opening being formed to extend on the upper surface of said step portion of said silicon nitride film by at least 0.1 times the width of said groove; and
  etching said silicon oxide film through said opening.

13. A method of manufacturing a semiconductor device, comprising the steps of:
  forming a resist mask on a silicon oxide film laid on a silicon nitride film having a step portion on a semiconductor substrate, in such a way as to have an opening above said step portion; and
  etching the silicon oxide film through said opening of the resist mask, by means of plasma etching through use of a processing gas comprising a mixture of a rare gas and a CF-based gas selected from the group consisting of $C_3F_6$, $C_4F_4$, $CF_3$—O—$CFHCF_3$ and a mixture of $C_4F_8$ and $CH_2F_2$, thereby tapering the shoulder of said step portion of said silicon nitride film; and forming an etching stopper film on an underlying layer on said semiconductor substrate, said etching stopper film being formed so as to have a groove with a width of less than 0.2 $\mu$m and height of not less than 2.5 times of said width.

14. A method of manufacturing a semiconductor device, comprising the steps of:
  forming a resist mask on a silicon oxide film laid on a $SiO_xN_y$ film having a step portion on a semiconductor substrate, in such a way as to have an opening above said step portion; and
  etching the silicon oxide film through said opening of the resist mask, by means of plasma etching through use of a processing gas comprising a mixture of a rare gas and a CF-based gas selected from the group consisting of $C_3F_6$, $C_4F_4$, $CF_3$—O—$CFHCF_3$ and a mixture of $C_4F_8$ and $CH_2F_2$, thereby tapering the shoulder of said step portion of said $SiO_xN_y$ film.

* * * * *